US011441747B2

(12) United States Patent
Lui, Jr. et al.

(10) Patent No.: US 11,441,747 B2
(45) Date of Patent: Sep. 13, 2022

(54) LIGHTING FIXTURE WITH REFLECTOR AND TEMPLATE PCB

(71) Applicant: IDEAL INDUSTRIES LIGHTING LLC, Racine, WI (US)

(72) Inventors: Nelson Man Hoi Lui, Jr., Tai Po (HK); Felix Chi Hoi Mung, Apex, NC (US); Gauss Ho Ching So, San Po Kong Kowloon (HK); Alan Hoi Leung Ng, Shatin (HK)

(73) Assignee: IDEAL INDUSTRIES LIGHTING LLC, Racine, WI (US)

( * ) Notice: Subject to any disclaimer, the term of this patent is extended or adjusted under 35 U.S.C. 154(b) by 0 days.

(21) Appl. No.: 17/011,563

(22) Filed: Sep. 3, 2020

(65) Prior Publication Data
US 2020/0400279 A1 Dec. 24, 2020

Related U.S. Application Data

(63) Continuation of application No. 14/145,355, filed on Dec. 31, 2013, now Pat. No. 10,788,177, which is a
(Continued)

(51) Int. Cl.
*H05K 3/00* (2006.01)
*F21V 7/09* (2006.01)
*F21V 29/77* (2015.01)
*H05K 3/34* (2006.01)
*F21Y 105/10* (2016.01)
(Continued)

(52) U.S. Cl.
CPC ............. *F21S 8/061* (2013.01); *H05K 1/182* (2013.01); *H05K 3/0061* (2013.01); *F21V 7/09* (2013.01); *F21V 29/773* (2015.01); *F21W 2131/40* (2013.01); *F21Y 2105/10* (2016.08); *F21Y 2115/10* (2016.08); *H05K 1/0203* (2013.01); *H05K 3/341* (2013.01); *H05K 2201/0397* (2013.01); *H05K 2201/09072* (2013.01); *H05K 2201/10106* (2013.01);
(Continued)

(58) Field of Classification Search
CPC ............................. F21W 2131/40; H05K 3/34
See application file for complete search history.

(56) References Cited

U.S. PATENT DOCUMENTS 4,231,080 A 10/1980 Compton
6,428,189 B1 8/2002 Hochstein
(Continued)

OTHER PUBLICATIONS

Cree® XL amp® CXA2530 LED Product Family Data Sheet, 15 pages.
(Continued)

*Primary Examiner* — Eric T Eide
(74) *Attorney, Agent, or Firm* — J. Clinton Wimbish; Nexsen Pruet, PLLC

(57) ABSTRACT

The present invention relates to different embodiments of lighting fixtures, such as high bay lighting fixtures, comprising one or more improved features. Some of these features include the direct mounting of emitters on a heat sink and/or the use of a template-like board for providing an electrical connection between emitters. These features can improve heat dissipation from the emitters and simplify fabrication. In other embodiments, expensive lens optics of prior art SSL fixtures can be replaced with a flat lens and reflector in order to produce a fixture having a satisfactory spacing criterion.

16 Claims, 23 Drawing Sheets

Related U.S. Application Data continuation-in-part of application No. 13/840,887, filed on Mar. 15, 2013, now Pat. No. 10,436,432.

(51) Int. Cl.
  *F21Y 115/10* (2016.01)
  *F21S 8/06* (2006.01)
  *H05K 1/18* (2006.01)
  *H05K 1/02* (2006.01)
  *F21W 131/40* (2006.01)

(52) U.S. Cl.
  CPC .............. *H05K 2201/10409* (2013.01); *H05K 2201/10477* (2013.01); *Y10T 29/49117* (2015.01)

(56) References Cited

U.S. PATENT DOCUMENTS

| | | | |
|---|---|---|---|
| 7,044,620 B2 | 5/2006 | Van Duyn | |
| 7,441,925 B2 | 10/2008 | Chou et al. | |
| 7,449,125 B2 | 11/2008 | Church et al. | |
| 7,771,087 B2 | 8/2010 | Wilcox et al. | |
| 7,794,124 B2 | 9/2010 | Hulsey et al. | |
| 7,824,070 B2 | 11/2010 | Higley et al. | |
| 7,936,561 B1 | 5/2011 | Lin | |
| 8,104,929 B2 | 1/2012 | Kovalchick et al. | |
| 8,186,852 B2 | 5/2012 | Dassanayake et al. | |
| 8,388,197 B1 | 3/2013 | Huang et al. | |
| 8,471,443 B2 | 6/2013 | Choi et al. | |
| 8,602,579 B2 | 12/2013 | Van De Ven et al. | |
| 8,602,598 B2 | 12/2013 | Duan et al. | |
| 8,618,742 B2 * | 12/2013 | Shum | H05K 1/189 315/291 |
| 8,692,444 B2 | 4/2014 | Patel et al. | |
| 8,708,522 B2 | 4/2014 | Wang | |
| 8,882,301 B2 | 11/2014 | Heerden et al. | |
| 9,039,254 B2 * | 5/2015 | Danesh | F21V 21/30 362/364 |
| 9,441,634 B2 | 9/2016 | Spiro | |
| 9,939,143 B2 | 4/2018 | Spiro | |
| 2004/0175189 A1 | 9/2004 | Weber-Rabsilber et al. | |
| 2005/0180157 A1 | 8/2005 | Watanabe et al. | |
| 2005/0243558 A1 * | 11/2005 | Van Duyn | F21S 43/15 362/294 |
| 2008/0043473 A1 | 2/2008 | Matsui et al. | |
| 2008/0130280 A1 | 6/2008 | Rodstein et al. | |
| 2008/0224166 A1 | 9/2008 | Glovatsky et al. | |
| 2009/0068856 A1 | 3/2009 | Low | |
| 2009/0290343 A1 * | 11/2009 | Brown | F21V 17/12 362/235 |
| 2010/0124058 A1 * | 5/2010 | Miller | F21V 29/773 362/249.02 |
| 2010/0246172 A1 * | 9/2010 | Liu | F21V 15/01 362/235 |
| 2011/0063865 A1 | 3/2011 | Komatsu et al. | |
| 2011/0068701 A1 | 3/2011 | Van De Ven et al. | |
| 2011/0068702 A1 | 3/2011 | Van De Ven et al. | |
| 2011/0110084 A1 | 5/2011 | Moon et al. | |
| 2011/0141728 A1 | 6/2011 | Russello et al. | |
| 2011/0204780 A1 | 8/2011 | Shum et al. | |
| 2012/0057327 A1 | 3/2012 | Le et al. | |
| 2012/0120659 A1 | 5/2012 | Lopez et al. | |
| 2012/0300461 A1 | 11/2012 | Lynch et al. | |
| 2013/0039056 A1 | 2/2013 | Cho et al. | |
| 2013/0114260 A1 * | 5/2013 | Lopez | F21V 29/02 362/249.02 |
| 2013/0176721 A1 | 7/2013 | Lu et al. | |
| 2013/0214666 A1 | 8/2013 | Leung et al. | |
| 2013/0265772 A1 | 10/2013 | Lu et al. | |
| 2013/0277690 A1 | 10/2013 | Ibbetson et al. | |
| 2013/0286637 A1 | 10/2013 | Lay et al. | |
| 2014/0192537 A1 * | 7/2014 | Chung | F28F 3/02 362/294 |
| 2014/0199168 A1 * | 7/2014 | Spiro | F21V 33/0096 416/5 |
| 2014/0268692 A1 | 9/2014 | Edmond et al. | |

OTHER PUBLICATIONS

"Cree Reflector Leaflet". Rev. 7 [available at http://www.nata.cn/images/newsletter/pdf/Cree%20Leaflet%20%28rev-7%29.pdf (retrieved Dec. 11, 2013).

Optimizing PCB Thermal Performance for Cree® XL amp® LEOs (available at http://www.cree.com/xlamp_app_notes/PCB_Thermal).

\* cited by examiner

Total Collected Power = 25280. lm
Efficiency = 0.93628
Maximum Intensity = 10273. cd

- - ■ - - L = 0.00000
——◆—— L = 90.000

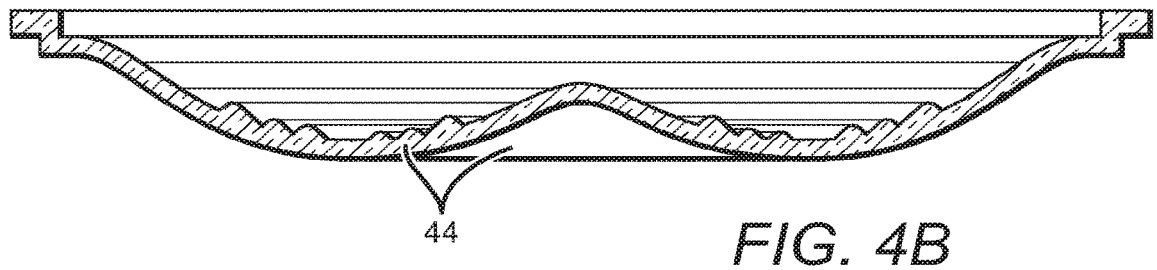
FIG. 4B
PRIOR ART
FIG. 4C
PRIOR ART
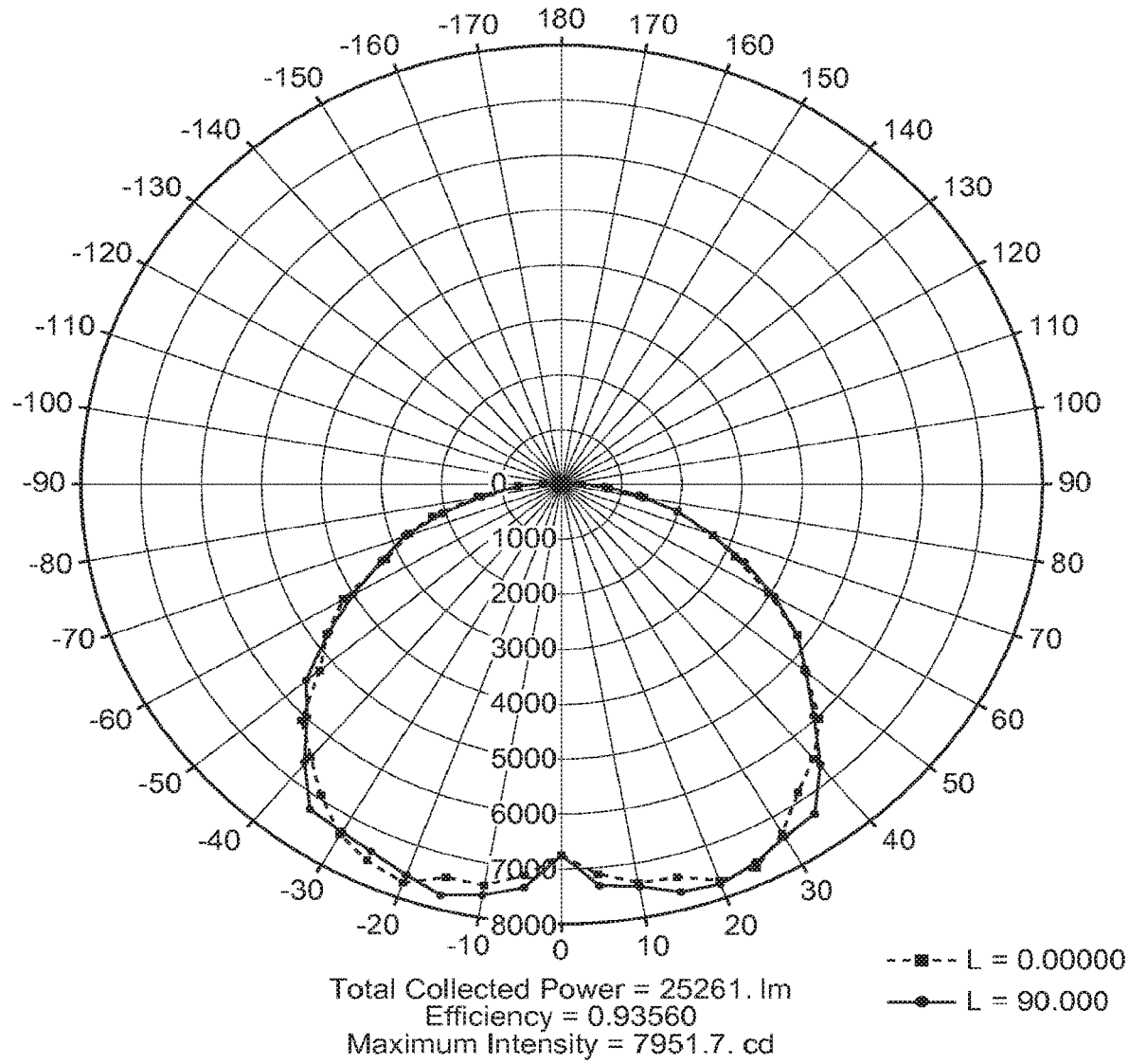
Total Collected Power = 25261. lm
Efficiency = 0.93560
Maximum Intensity = 7951.7. cd
- - ■ - - L = 0.00000
——◆—— L = 90.000

FIG. 7B
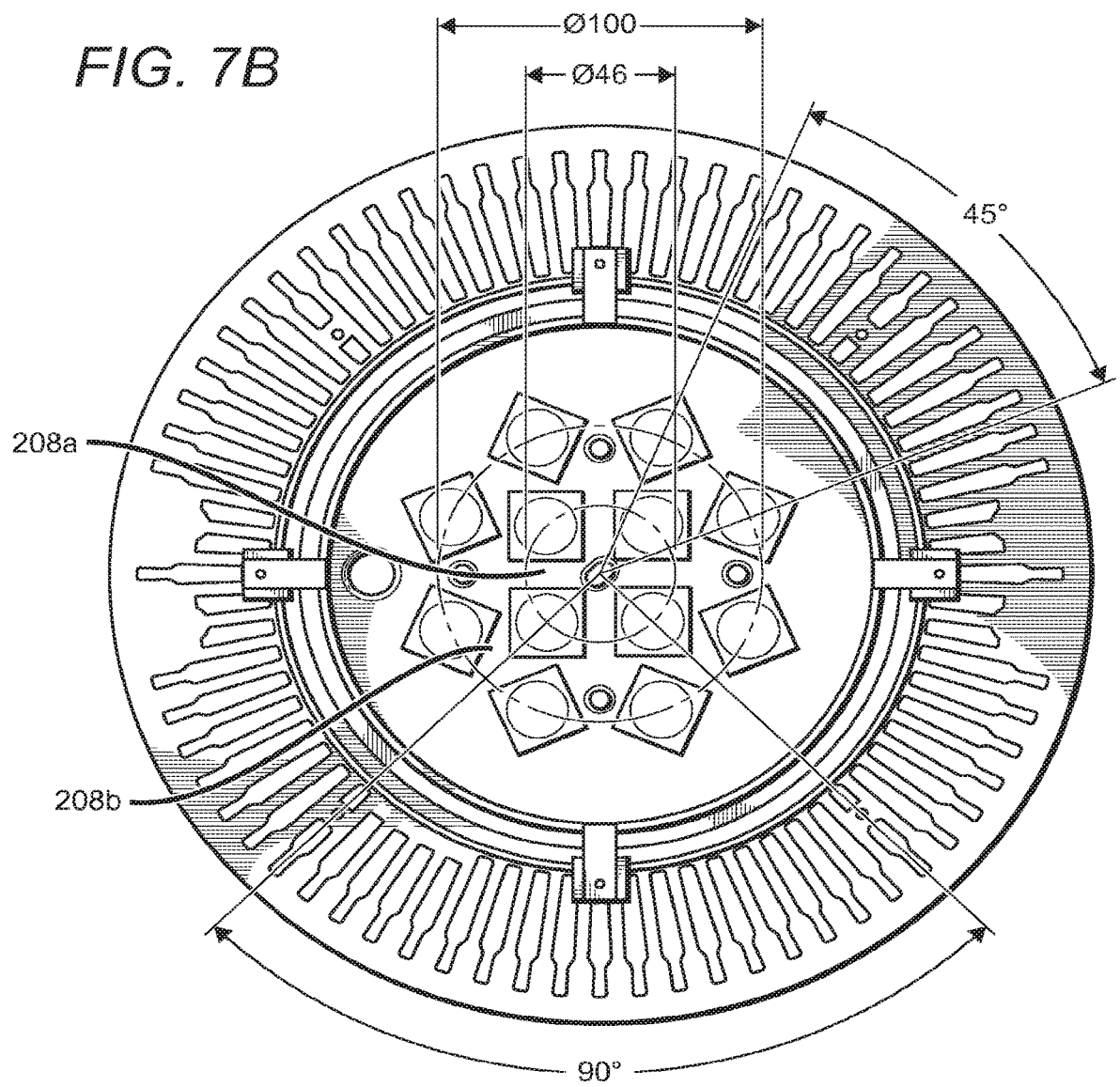
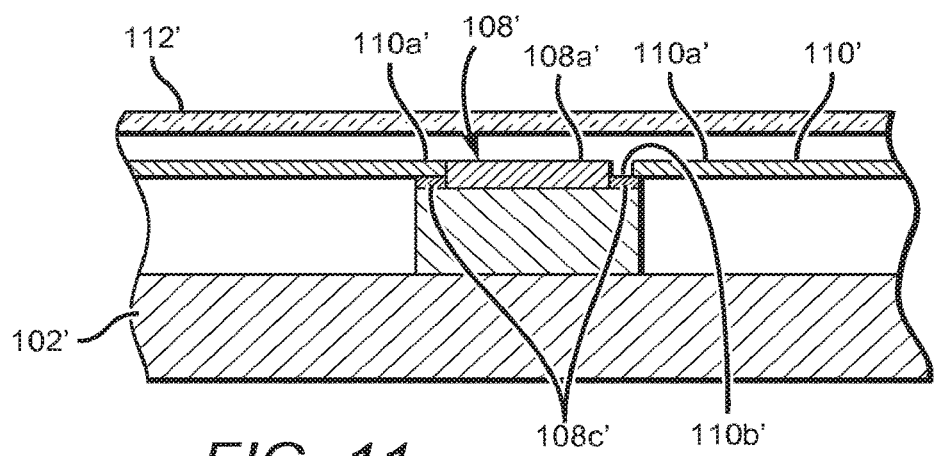
FIG. 11

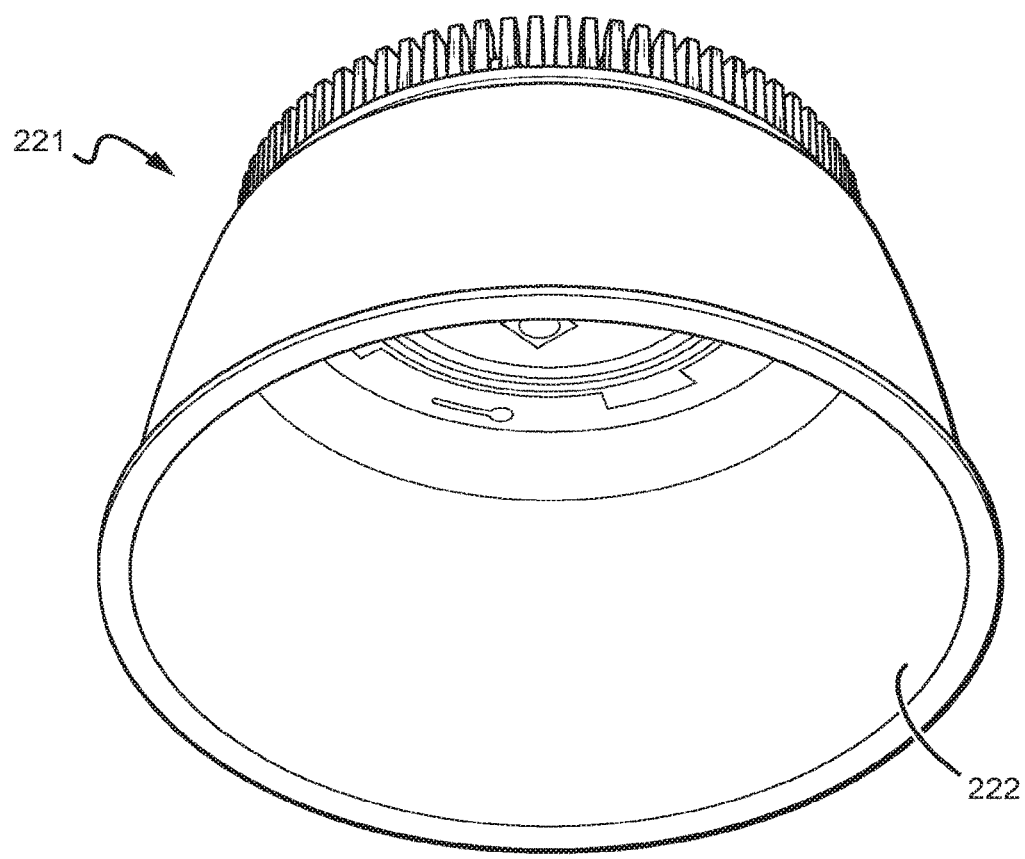
FIG. 14A
FIG. 14B
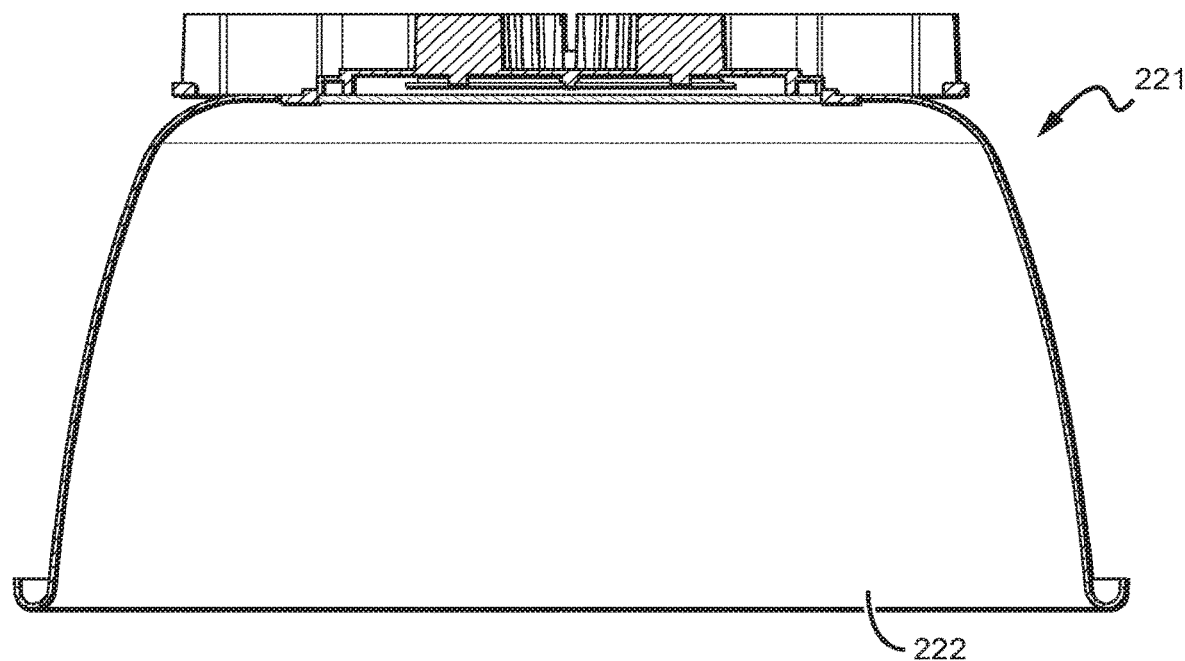

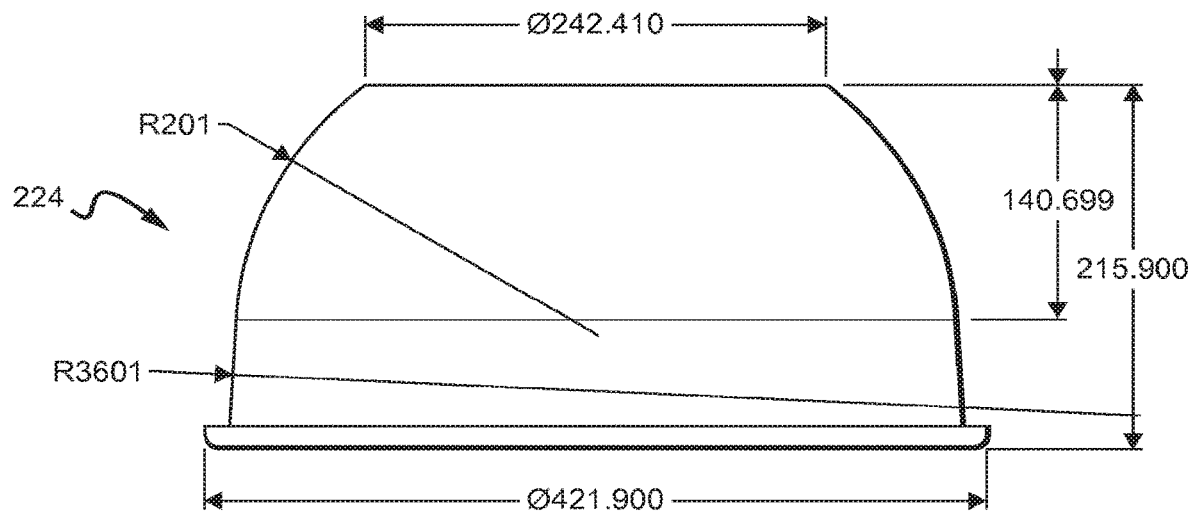
FIG. 15C
FIG. 15D
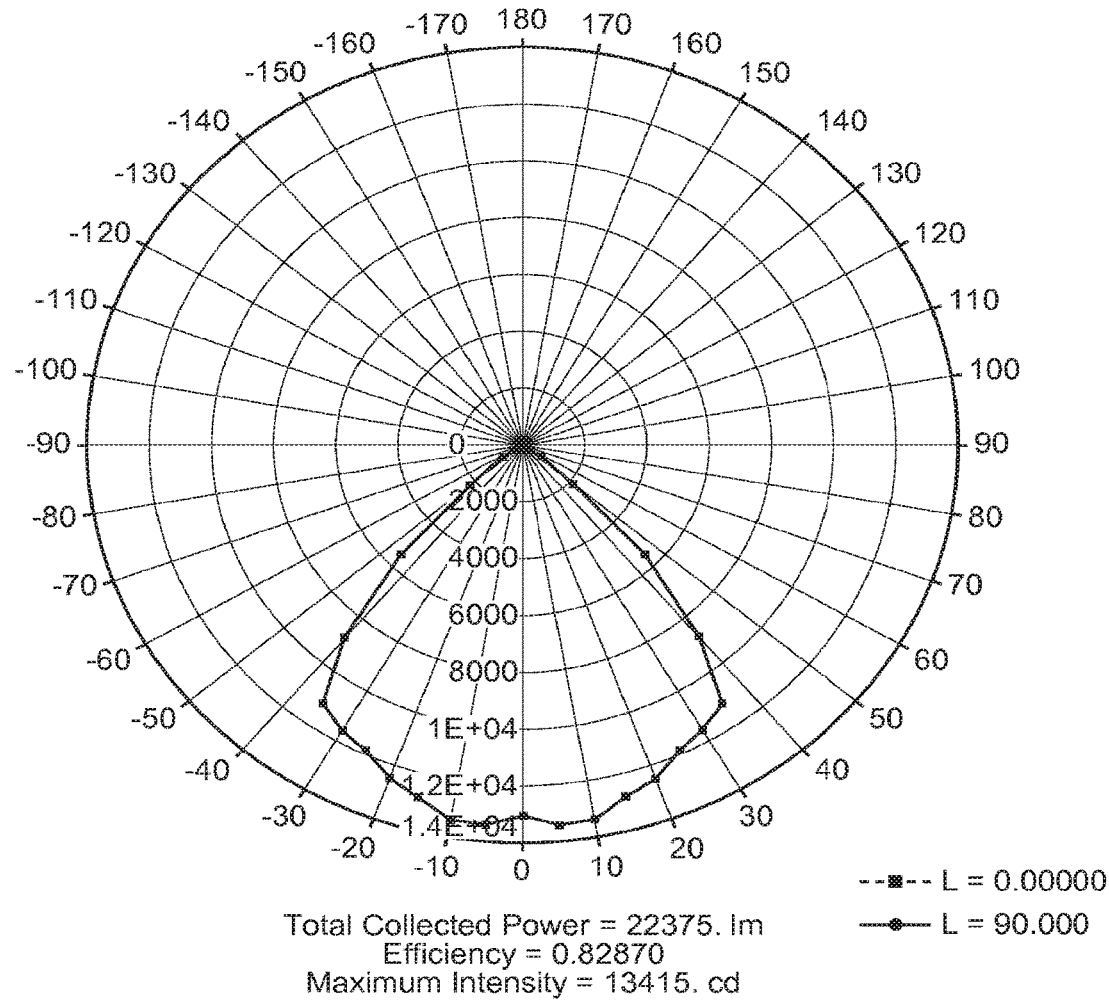
Total Collected Power = 22375. lm
Efficiency = 0.82870
Maximum Intensity = 13415. cd
--■-- L = 0.00000
--●-- L = 90.000

US 11,441,747 B2

LIGHTING FIXTURE WITH REFLECTOR AND TEMPLATE PCB

CROSS-REFERENCE TO RELATED APPLICATION

This application is a continuation of U.S. patent application Ser. No. 14/145,355; filed Dec. 31, 2013; which is a continuation-in-part of U.S. patent application Ser. No. 13/840,887 to van de Ven et al., filed Mar. 15, 2013 and entitled "Aluminum High Bay Design," both of which are incorporated by reference herein in their entirety.

BACKGROUND OF THE INVENTION

1. Field of the Invention

The present invention relates generally to lighting fixtures, and in particular to high bay lighting fixtures with light sources mounted directly on a heat sink without an intervening printed circuit board, and/or lighting fixtures with a reflector that can produce a desired emission pattern.

2. Description of the Related Art

Industrial or commercial buildings are often illuminated by free-standing lighting fixtures that may be suspended from the ceiling. Certain types of commercial or industrial environments, such as store aisles or warehouses, require lighting that is designed to provide a high degree of luminosity while still maintaining control over glare. The type of lighting fixture that satisfies these requirements is commonly referred to as a bay lighting fixture.

Bay lighting may be classified as high bay or low bay, depending on the height of the lighting fixture, which is usually the distance between the floor of the room seeking to be illuminated and the fixture itself. Naturally, large industrial or commercial buildings with overhead lighting are typically illuminated with high bay lighting fixtures.

In order to sufficiently illuminate this type of environment, a high bay lighting fixture with a high intensity discharge can be used. Yet high intensity lighting fixtures often use light sources such as incandescent, halogen, or fluorescent bulbs, which can have short life spans, difficulty maintaining their intensity, and/or high maintenance costs. The advent of solid state lighting devices with longer life spans and lower power consumption presented a partial solution to these problems.

One example of a solid state lighting device is a light emitting diode (LED). LEDs convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In comparison to other light sources, LEDs can have a significantly longer operational lifetime. Incandescent light bulbs have relatively short lifetimes, with some having a lifetime in the range of about 750-1000 hours. Fluorescent bulbs can also have lifetimes longer than incandescent bulbs such as in the range of approximately 10,000 to 20,000 hours, but provide less desirable color reproduction. In comparison, LEDs can have lifetimes between 50,000 and 70,000 hours. The increased efficiency and extended lifetime of LEDs is attractive to many lighting suppliers and has resulted in LED lights being used in place of conventional lighting in many different applications. It is predicted that further improvements will result in their general acceptance in more and more lighting applications. An increase in the adoption of LEDs in place of incandescent or fluorescent lighting would result in increased lighting efficiency and significant energy saving.

As mentioned above, high bay lighting fixtures usually require a high intensity light source, based on the illumination requirement of their industrial or commercial environment. Yet a problem with most high intensity lighting devices is that they can draw large currents, which in turn generates significant amounts of heat. High intensity LEDs are no exception. The type of high intensity LEDs used in high bay lighting fixtures likewise produce a large amount of heat. Even if an LED is particularly efficient, the amount of heat that it produces can still be substantial. Without an effective way to dissipate heat that is produced, LED light sources can suffer elevated operating temperatures, which can increase their likelihood of failure and/or otherwise degrade performance. Therefore, in order to operate most effectively and reliably, LED light sources need an efficient method to dissipate heat.

One common method that LED high bay lighting fixtures use for heat dissipation is a heat sink. A heat sink is essentially an element that is in thermal contact with a light source so that it dissipates heat from the light source. Whenever the heat dissipation ability of the basic lighting device is insufficient to control its temperature, a heat sink is desirable. Some common heat sink materials are aluminum alloys, but other materials or combinations of materials with good thermal conductivity and heat dissipation potential will suffice.

Many common LED high bay lighting fixtures include a heat sink that is in thermal contact with the light source. FIG. 1 displays one such example of a typical LED high bay lighting fixture 10. Included in this example are an LED driver housing 12, a heat sink 14, and a spun housing 16. The heat sink 14 can be a large "extrusion/stack fin" heat sink, which can be made of a heat conductive material such as aluminum. Likewise, the spun housing 16 can also be composed of a metal such as aluminum. The large size of the heat sink 14 is typical in order to dissipate the heat from a high intensity light source commonly used in high bay lighting.

FIG. 2 displays another example of a traditional LED high bay lighting fixture 20. In this example, the high bay lighting fixture 20 includes a high intensity discharge ballast 22 and a spun housing 26. Lighting ballasts can refer to any component that is intended to limit current flow through a light source. The ballast 22 displayed in FIG. 2 is a common choice for many high bay lighting fixtures and other high intensity discharge lighting fixtures. As in the previous example, the spun housing 26 is typically made of aluminum.

Another problem in fixtures such as high bays is finding a cost-effective way to achieve a desired emission profile. One indicator of the effectiveness of a fixture's emission pattern is the fixture's spacing criterion (SC), which is a unitless factor that relates the mount height of the fixture to the maximum recommended spacing between fixtures to achieve an even pattern of light on the floor. The equation relating these is SC*(mount height)=(maximum recommended spacing). Thus, fixtures with a higher SC can be considered to be more cost effective than those with a lower SC, since the allowable spacing between high-SC fixtures will be larger than that of low-SC fixtures. Some non-SSL fixtures, such as fluorescent fixtures, can have an SC of 1.2-1.3.

If a fixture does not emit equally at all angles about its primary emission, the fixture can be said to have a first spacing criterion in one plane including the primary emission and a second spacing criterion in a plane perpendicular to the first and including the primary emission (e.g., a 0.degree.-180.degree. plane spacing criterion and a 90.degree.-270.degree. plane spacing criterion). Bay lighting fixtures typically are designed for omnidirectional purposes and thus have equal or approximately equal 0.degree.-180.degree. plane spacing criterion and 90.degree.-270.degree. spacing criterion, although the below embodiments and descriptions can be adapted for non-equal SC applications.

FIG. 3A shows a prior art LED high bay lighting fixture 30 that includes an individualized lens 34 over each light source (not shown). As shown by FIG. 3B, an intensity distribution profile of one embodiment of the fixture 30, the fixture 30 can have a max intensity that is about equal between about 10.degree. and about 30.degree., 50% intensity at about 50-55.degree., a nadir intensity vs. max intensity ratio of about 95%, and little to no light emitting at about 60.degree. and wider. While such an arrangement can improve SC to, for example, about 1.56, the cost of individualized lenses 34 can be high.

FIG. 4A shows a second prior art LED high bay lighting fixture 40. Instead of individual lenses like those shown in FIG. 3A, the fixture 40 includes a single lens 44 over the sources (not shown) such that the fixture 40 can have SC from 1.54-1.58. A cut-away view of the lens 44 is shown in FIG. 4B. As shown by FIG. 4C, the fixture 40 can have a max intensity at about 20.degree., 50% intensity at about 60.degree., a nadir intensity vs. max intensity ratio of about 90%, and light emitting at very high angles (for instance, a measurable and readable intensity of about 15%-20% at 80.degree.). Just as with individualized lenses, the cost of a shaped lens such as the lens 44 can be prohibitively high. Further, both the individualized lenses 34 and the shaped lens 44 can cause more glare than, for example, a flat lens.

One particularly labor intensive part of fabricating light emitting devices, and particularly fixtures including multiple emitters, is providing electrical connections to the emitters. FIG. 5 shows a prior art LED 50 mounted on a prior art circuit board 56, which is then mounted on a heat sink 59. The LED 50 can be, for example, a single emitter, or can be a package comprising an array of LEDs. The LED 50 has two top-side contacts which are wirebonded to traces 58 which are present on the circuit board 56. The process of wirebonding LEDs to traces on a circuit board can be relatively labor intensive, and wirebonding can have lower reliability than other bonding methods.

SUMMARY OF THE INVENTION

Based on the aforementioned issues, there is an increasing demand for options within high bay lighting that can more effectively dissipate the heat generated by the light source. Additionally, there is a need for a fixture which can generate a sufficient spacing criteria without the cost of individualized or shaped optics.

One embodiment of a lighting fixture according to the present invention can comprise a heat sink, one or more emitters on the heat sink, and a circuit board. A bottom surface of the emitters can be below a top surface of the circuit board.

Another embodiment of a lighting fixture according to the present invention can comprise a heat sink, a circuit board, and an array of emitters. The circuit board can be shaped to define one or more cut-outs, and each of the emitters can be at least partially within one of the cut-outs.

One embodiment of a method according to the present invention can comprise providing a heat sink, mounting one or more emitters on the heat sink, and mounting a circuit board on the heat sink. The circuit board can have cut-outs and can be mounted such that each of the emitters is at least partially within one of the cut-outs.

Another embodiment of a lighting fixture according to the present invention can comprise an array of solid state emitters on a heat sink, a flat lens over the emitters, and a reflector configured to redirect at least some light emitted by the solid state emitters. The fixture can have a spacing criterion of about 1.5 or higher.

One embodiment of a reflector according to the present invention can comprise an upper portion with a cross-section defined by an arc with a first radius, and a lower portion with a cross-section defined by a second arc with a second radius. The radius of the second arc can be larger than that of the first arc. A transition point between the arcs can be in the upper half of the reflector.

These and other aspects and advantages of the invention will become apparent to those skilled in the art from the following detailed description and the accompanying drawings, which illustrate by way of example the features of the invention.

BRIEF DESCRIPTION OF THE DRAWINGS

FIGS. 4A-4C are a bottom perspective view, a lens cut-away view, and an intensity distribution plot, respectively, of yet another prior art high bay lighting fixture;

FIGS. 7A and 7B are bottom perspective and bottom views, respectively, of part of the light engine from FIGS. 6A-6D;

FIG. 11 is a cut-away view of part of another embodiment of a light engine according to the present invention;

FIGS. 14A-14E are a bottom perspective view, a side view, an exemplary dimensioned view, an intensity distribution plot, and a ray trace, respectively, of another embodiment of a high bay fixture according to the present invention; and FIGS. 15A-15E are a bottom perspective view, a side view, an exemplary dimensioned side view, an intensity distribution plot, and a ray trace, respectively, of yet another embodiment of a high bay fixture according to the present invention.

DETAILED DESCRIPTION OF THE INVENTION

Figure 1:
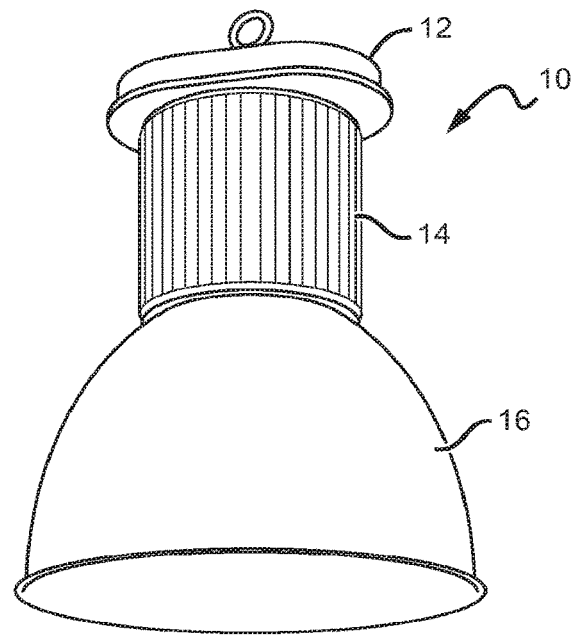
FIG. 1 is a bottom perspective view of a prior art high bay lighting fixture.

Embodiments of the present invention have similarities to embodiments described in commonly assigned utility application U.S. patent application Ser. No. 14/145,559 to Lui et al., entitled "Lighting Fixture with Branching Heat Sink and Thermal Path Separation" and filed concurrently on the same day as the present application. This application is fully incorporated by reference herein in its entirety.

Embodiments of the present invention have similarities to embodiments described in commonly assigned design application U.S. patent application Ser. No. 29/478,149 to Lui et al., entitled "Bay Lighting Fixture" and filed concurrently on the same day as the present application. This application is fully incorporated by reference herein in its entirety.

The present invention is directed to different embodiments of lighting fixtures comprising one or more of various features which can improve one or more of the fixture's source intensity, efficiency, output profile, ease of fabrication, and many other attributes. One of these features can be a template-style circuit board with cut-outs within which emitters can be mounted. Because the emitters are not mounted on, for example, a top surface of the circuit board, they can instead be directly mounted on the heat sink. This can improve the thermal dissipation of the emitters and/or the thermal dissipation of the fixture as a whole. Another of these features can be an improved fixture spacing criterion over prior art fixtures, and/or a spacing criterion similar to prior art fixtures but achieved using cheaper components.

One embodiment of the present invention can include a stencil- or template-shaped PCB or other circuit board for providing electrical interconnections between the emitters in an array. In any particular order, the emitters can be mounted on the heat sink and the PCB can be mounted over and/or around the emitters, as opposed to the prior art where the emitters are on the PCB. Finger-like portions of the PCB can be over contact portions of the emitters to provide electrical connections. The emitters can be mounted directly on the heat sink, with the PCB eliminated as an intermediary. Thus, thermal dissipation from the emitters to the heat sink can be improved and there is no need to use an expensive PCB designed for thermal dissipation, such as a metal core PCB (MCPCB) or an FR-4 board having conductive vias.

Other embodiments of the present invention can have designs that either have improved spacing criterion over prior art fixtures or achieve a similar spacing criterion using cheaper parts. Most traditional solid state lighting high bay fixtures do not use reflectors like those used in non-SSL bay lighting applications. Bay fixtures use an expensive optic system, such as lenses over individual emitters or shaped lenses, to achieve an acceptable SC. Embodiments of the present invention achieve this SC or better using a reflector and/or a flat and/or planar lens, which is much cheaper than the lens configurations of the prior art.

Embodiments of the invention are described herein with reference to different views and illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing.

Throughout this description, the preferred embodiments and examples illustrated should be considered as exemplars, rather than as limitations on the present invention. As used herein, the term "invention," "device," "method," or "present invention" refers to any one of the embodiments of the invention described herein, and any equivalents. Furthermore, reference to various feature(s) of the "invention," "device," "method," or "present invention" throughout this document does not mean that all claimed embodiments or methods must include the referenced feature(s).

The present invention is described below in regards to certain lamps and/or fixtures having one or multiple LEDs or LED chips or LED packages in different configurations, but it is understood that the present invention can be used for many other lamps having many different configurations. The term "source" can be used as all-encompassing to describe a single light emitter or multiple light emitters. The embodiments below are described with reference to LED or LEDs and/or source or sources, but it is understood that this is meant to encompass LED chips and LED packages as well as other solid state emitters. The components can have different shapes and sizes beyond those shown and different numbers of LEDs can be included. It is also understood that some of the embodiments described below utilize co-planar light sources, but it is understood that non co-planar light sources can also be used. It is also understood that the lamp's LED light source may be comprised of one or multiple LEDs, and in embodiments with more than one LED, the LEDs may have different emission wavelengths. Similarly, some LEDs may have adjacent or contacting phosphor layers or regions, while others may have either adjacent phosphor layers of different composition or no phosphor layer at all.

It is also understood that when an element or feature is referred to as being "on" or "adjacent" to another element or feature, it can be directly on or adjacent the other element or feature or intervening elements or features may also be present. In contrast, when an element is referred to as being "directly on" or extending "directly onto" another element, there are no intervening elements present other than, in some cases, an adhesive or a material strictly used for the purpose of properly connecting the two elements. Additionally, it is understood that when an element is referred to as being "connected" or "coupled" to another element, it can be directly connected or coupled to the other element or intervening elements may be present.

Relative terms such as "outer," "above," "lower," "below," "horizontal," "vertical" and similar terms may be used herein to describe a relationship of one feature to another. It is understood that these terms are intended to encompass different orientations in addition to the orientation depicted in the figures.

Although the terms first, second, etc. may be used herein to describe various elements or components, these elements or components should not be limited by these terms. These terms are only used to distinguish one element or component from another element or component. Thus, a first element or component discussed below could be termed a second element or component without departing from the teachings of the present invention. As used herein, the term "and/or" includes any and all combinations of one or more of the associated list items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

FIGS. 6A-6D are exploded perspective, bottom, side, and top views of a light engine 100 according to one embodiment of the present invention. The light engine 100 can, for example, be used in bay lighting such as a high bay fixture. The light engine 100 can include a heat sink 102 which can itself include a mounting area 104. Some exemplary heat sinks which can be used in embodiments of the present invention are described and shown in the above referenced incorporated applications to Lui et al., and commonly assigned and incorporated parent application Ser. No. 13/840,887. The mounting area 104 can include integral mount pads 106, although some embodiments may not include these mount pads 106. The light engine 100 can also include a template PCB 110, which will be described in detail below, and/or a lens 112. In the embodiment shown, the lens 112 can be flat and/or planar, and/or glass, and can be at least partially held in place by one or more lens holders 113. A lens such as the lens can 112 can serve to physically protect the emitters 108, which will be discussed in detail below.

Figure 7A:
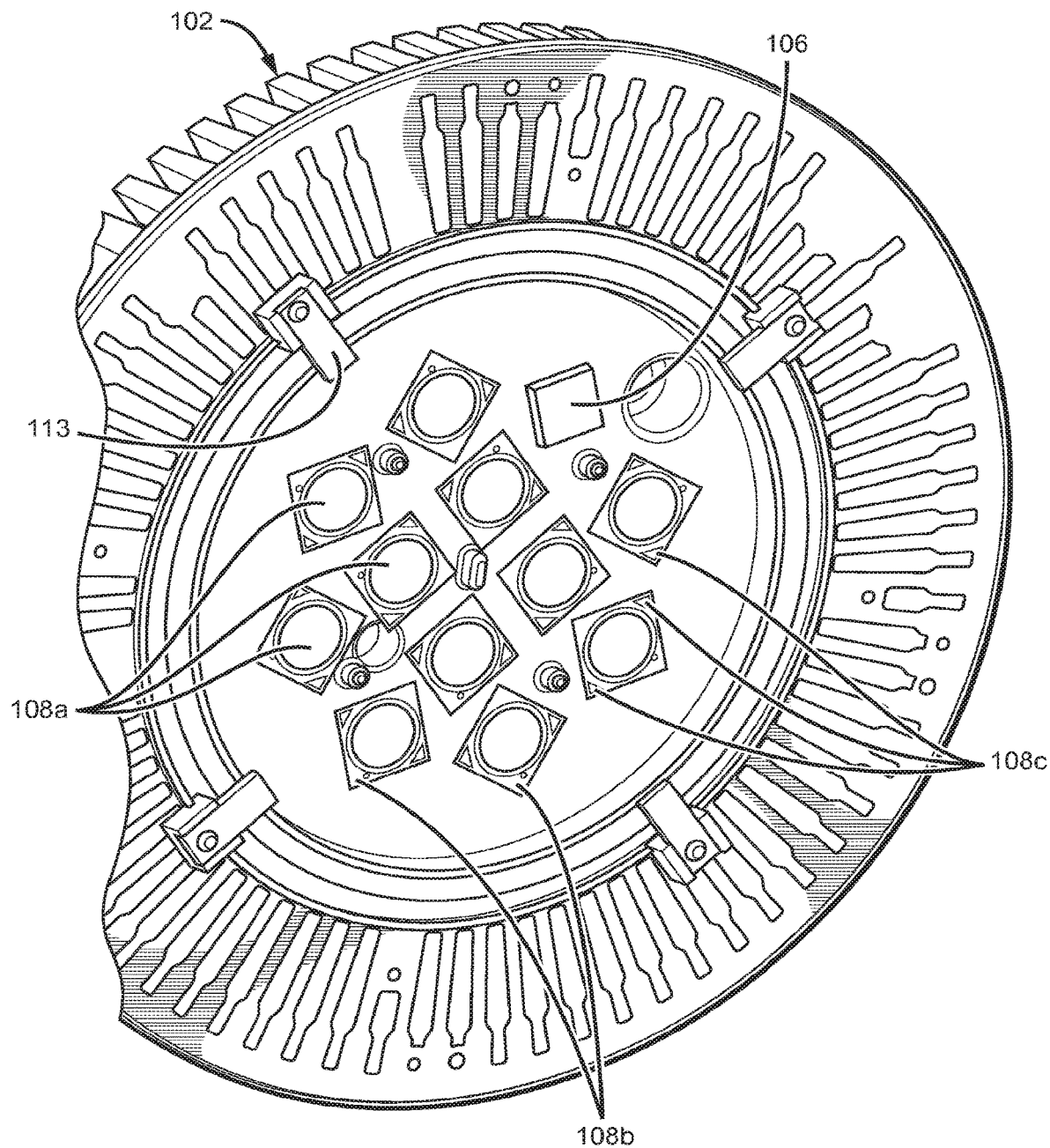

The light engine 100 can include a source such as the emitters 108. In the embodiment shown, the light engine 100 can comprise twelve emitters 108 which can have an arrangement that will be detailed below. Each of the emitters can include a light-emitting portion 108a, a submount 108b, and one or more contacts 108c, as best seen in FIG. 7A, which will be discussed in detail below. In this case, each of the emitters 108 includes two contacts 108c which can be on a top surface of the submount 108b, although other embodiments are envisioned.

Many different types of emitters can be used in embodiments of the present invention.

For example, in the embodiment shown the Cree® XLamp® CXA 2530 LED array can be used for each of the emitters 108. This particular array delivers high lumen output and efficacy. The data sheet of the CXA 2530 is incorporated herein by reference in its entirety. Other Cree® emitters can be used in the present invention, including but not limited to any of the Cree CXA series such as the CXA 1520, CXA 2520, and CXA 3590, MC-E, MK-R, ML-B, ML-C, ML-E, MP-L, MT-G, MT-G2, MX-3, MX-6, XB-D, XM-L, XM-L2, XP-C, XP-E, XP-E2, XP-G, XP-G2, XR-C, XR-E, and XT-E. This list should not be construed as limiting, as many different solid state emitters, emitter arrays, LEDs, and/or LED arrays can be used.

While the emitters 108 can all emit the same color (e.g., white), in other embodiments different color emitters can be used. Further, color mixing optics can be used to efficiently mix the light emitted by these emitters. The use of multicolor arrays in SSL fixtures is discussed in detail in U.S. patent application Ser. No. 13/828,348 to Edmond et al. and entitled "Door Frame Troffer", and U.S. patent application Ser. No. 13/834,605 to Lay et al. and entitled "Indirect Linear Fixture", each of which is commonly assigned with the present application and each of which is fully incorporated by reference herein in its entirety.

In yet other embodiments, the emitters 108 can emit all the same color while a remote phosphor is used to convert at least some source light to a different wavelength, with the fixture emitting a combination of converted and unconverted light. One embodiment emits a combination of blue light from the sources and yellow light from the remote phosphor for a white light combination. Another embodiment emits a combination of blue light from the sources and yellow and red light from phosphor for a warmer white light combination. Some examples of source and remote phosphor configurations and types which can be used in embodiments of the present invention are described in U.S. patent application Ser. No. 13/034,501 to Le et al. and entitled "Solid State Lamp and Bulb", which is fully incorporated by reference herein in its entirety.

FIGS. 7A and 7B show a bottom perspective view and a bottom view of the emitters 108 mounted on the heat sink 102, with FIG. 7B showing exemplary dimensions. FIG. 7A is shown with only 11 emitters in order to show one of the mount pads 106; it is understood that an emitter can also be mounted on this mount pad, as shown in FIG. 7B. The sources 108 can be mounted directly on the heat sink 102 using an adhesive, such as a thermally conductive adhesive. Adhesives used for bonding sources according to the present invention can also be very thin so as to minimize thermal resistance. The sources 108 can also be mounted using a thermally conductive patch. When the term "mounted directly on" is used herein, it is understood that some sort of adhesive may be between the elements unless stated otherwise. The sources 108 can be mounted on a mounting area such as the mounting area 104, which can be flat or alternatively can be shaped such that the sources 108 are non-planar in relation to one another. If the heat sink 102 includes mount pads 106, each of the sources 108 can be mounted on one of the mount pads 106. The mount pads 106 can be integral with and/or formed as part of the heat sink 102, or can be separately attached. The mount pads 106 can serve to raise the emitters to a height at which emitted light will not intercept other elements, such as the PCB 110 shown in FIG. 6A. The mount pads 106 can therefore reduce losses and/or shadows. This relationship will be described in detail below.

Mounting the sources 108 on the heat sink 102 without an intervening PCB is one way of improving thermal dissipation. Fixtures according to the present invention can also have improved thermal dissipation due to a number of other factors. For example, in one embodiment the thermal dissipation paths of the sources 108 and the circuitry driving the sources 108 are separate and/or do not overlap. In another embodiment, the heat sink upon which the sources 108 are mounted can include branching spokes, which can improve conductive dissipation, and spaces between the spokes, which can improve convective dissipation. These and other thermal dissipation methods and structures according to the present invention are described in detail in commonly assigned and concurrently filed U.S. patent application Ser. No. 14/145,559 to Lui et al. and entitled "Lighting Fixture with Branching Heat Sink and Thermal Path Separation", which is fully incorporated by reference herein in its entirety. Other methods and structures are possible.

Figure 8A:
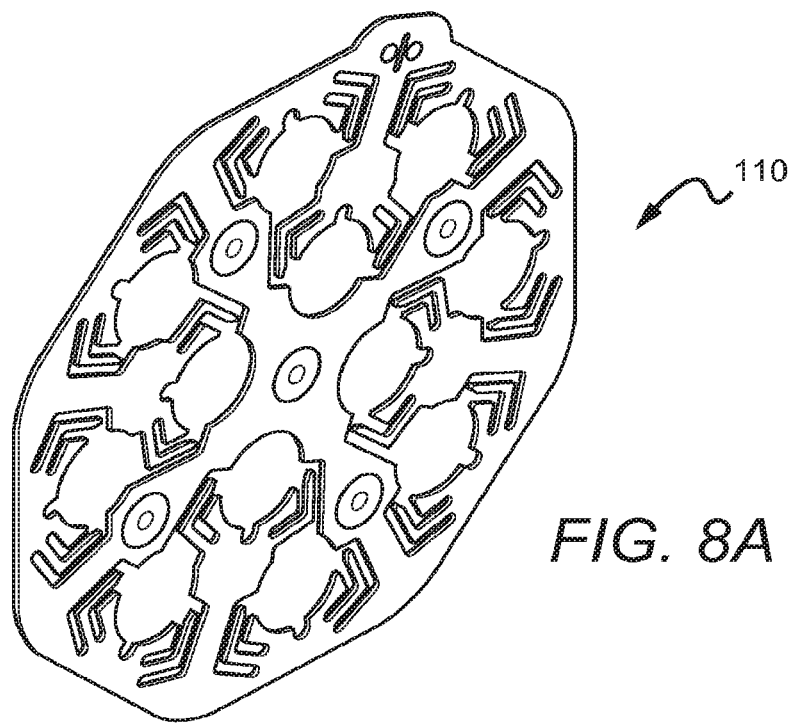
FIGS. 8A and 8B are perspective and exemplary dimensioned bottom views, respectively, of one embodiment of a circuit board according to the present invention.
Figure 8B:
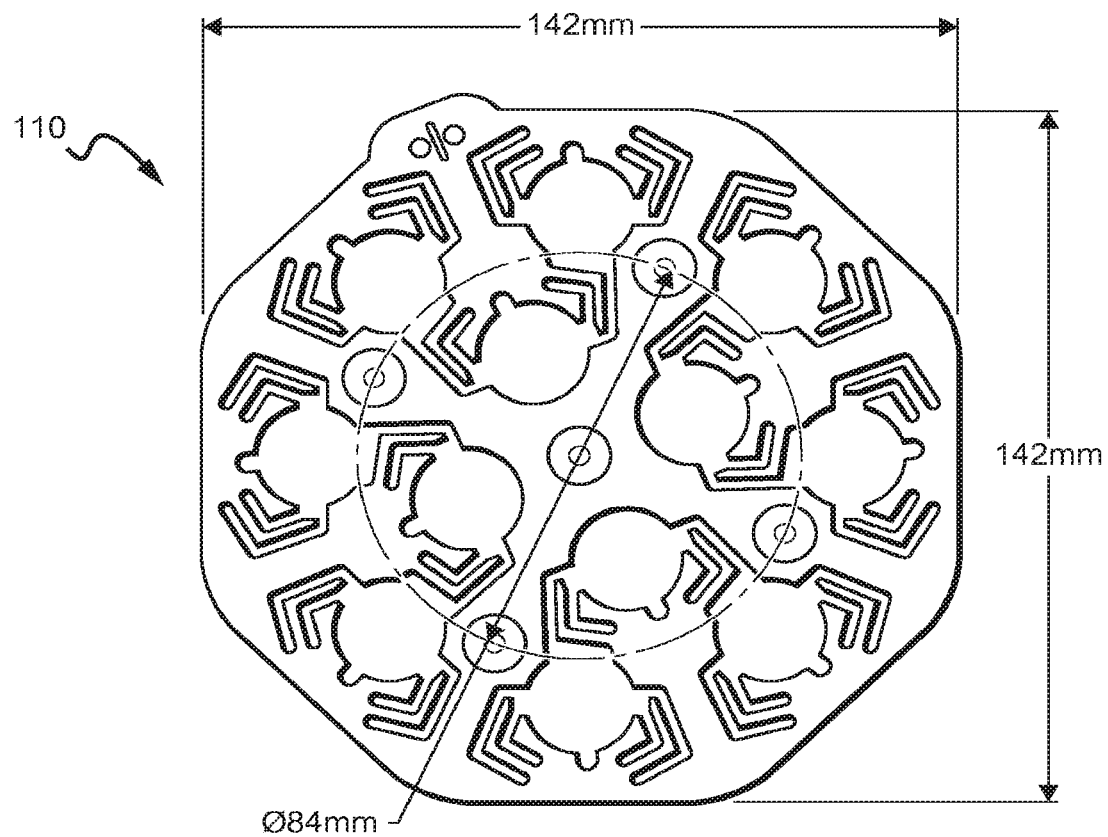

The light engine 100 can also include a circuit board such as the template printed circuit board (PCB) 110. The template PCB 110 can be mounted over and/or around the emitters 108 instead of underneath the emitters 108. FIGS. 8A and 8B show bottom perspective and exemplary dimensioned bottom views of one embodiment of the template PCB 110. While the terms printed circuit board and/or PCB are used herein, it is understood that this term is used in a generic sense and refers to any type of board that can be used for electrically interconnecting elements and/or can be used in place of a traditional PCB, including but not limited to traditional PCBs, metal core PCBs (MCPCBs), FR-4 PCBs, ceramic substrates with electrical interconnections, laminate substrates with electrical interconnections, and/or any monolithic substrate which provides electrical interconnections between elements, among others. These prior art PCBs can include many features that can be expensive and/or difficult to fabricate. For instance, an MCPCB includes a relatively expensive metallic layer. Other prior art boards include vias which have to be machined, and which in some embodiments are plated with a conductive material. These boards can be expensive and difficult to fabricate.

Figure 9A:
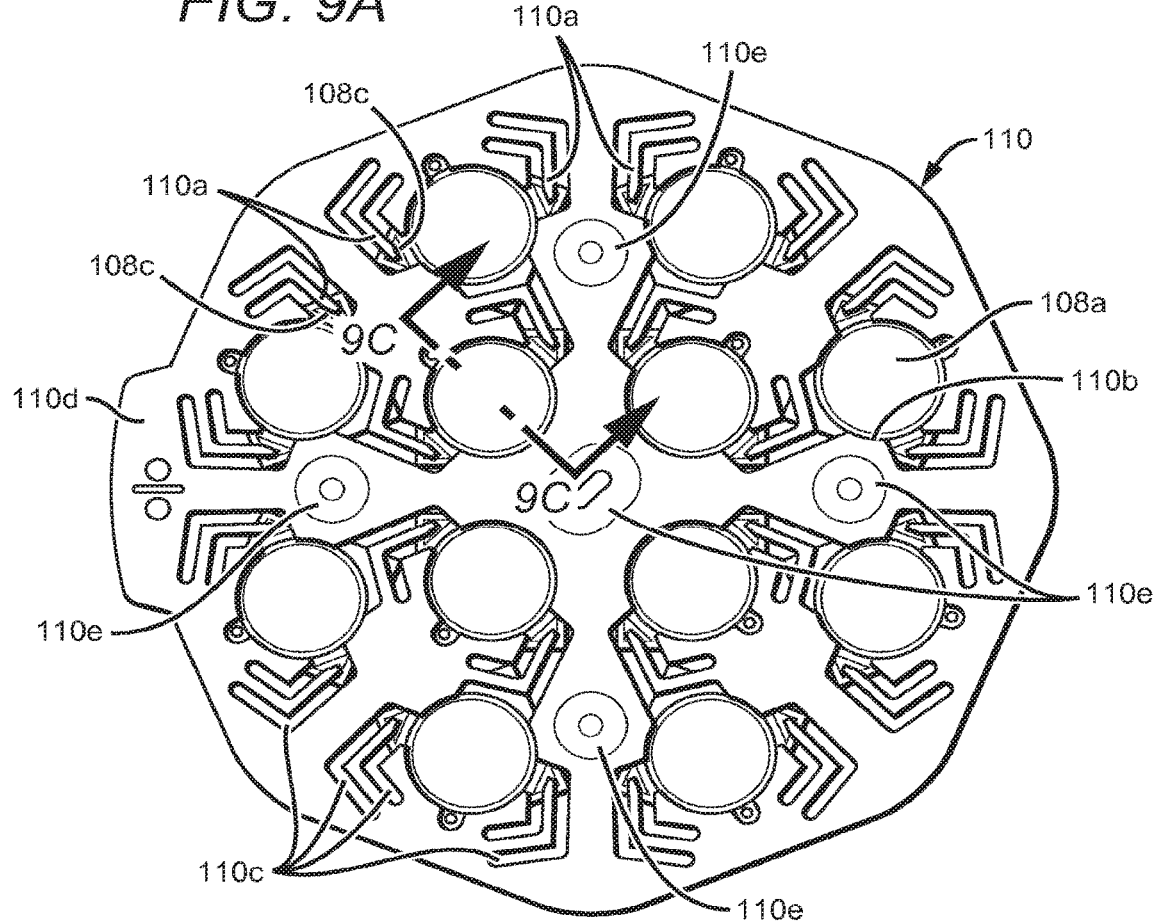
FIGS. 9A-9C are top, side, and cut-away views, respectively, of a circuit board and emitters according to an embodiment of the present invention.
Figure 9B:
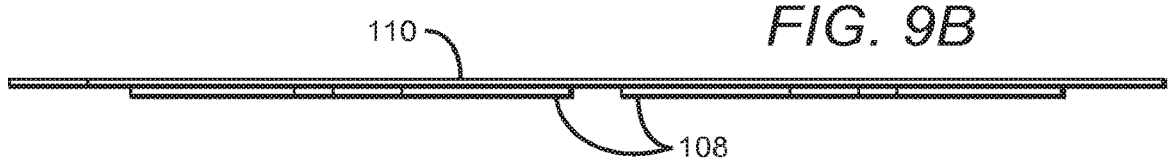
Figure 9C:
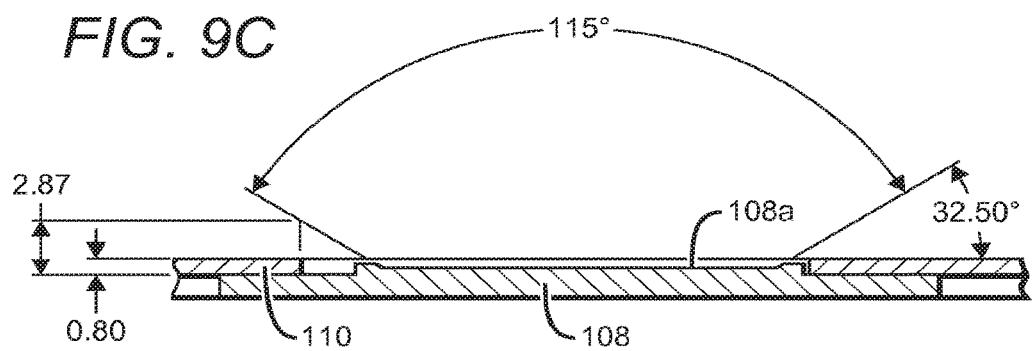

FIGS. 9A-9C show the template PCB 110 with emitters 108 attached thereto. The template PCB 110 can be shaped to define one or more cut-outs 110b and/or slots 110c. Cut-outs 110b can be simple cut-outs of empty space, or can comprise a transparent material such as glass and/or can include individualized lenses. The PCB 110 can be placed over the emitters 108 such that the emitting portion 108a of each of the emitters 108, or the entire emitter, is partially or wholly exposed through one of the cut-outs 110b. This arrangement can reduce or eliminate incidences of light from the emitters 108 reflecting off of the PCB (such as the PCB underside and/or one of the cut-out sidewalls), which can cause losses and/or shadows. Additionally, the PCB 110 can have a low profile and/or small thickness to reduce or eliminate shadows. For example, as shown in FIG. 9C showing exemplary PCB and LED dimensions, the PCB can have a thickness of about 1 mm or less, such as about 0.8 mm. In other embodiments the thickness of the PCB can range from about 1 mm to just under 2.87 mm (in one embodiment, 2.86 mm). The PCB can be thin enough so as to not intercept light from a source, as shown in FIG. 9C.

In the embodiment having the exemplary dimensions shown in FIG. 9C, the viewing angle of the emitters 108 is approximately 115.degree. As can be seen, the top of the PCB 110 defines a plane slightly above the plane defined by the emitters 108. However, due to the spacing of the emitter 108 and the PCB 110, light emitted from the emitter 108 will not intersect the PCB 110, which can reduce or eliminate shadows. In the specific case shown, the PCB 110 could have a thickness of under approximately 2.87 mm without intersecting light from the emitters 108. The actual thickness of about 0.8 mm can be chosen for mechanical purposes such as support.

FIGS. 10A-10D show a bottom perspective view and three different cut-away views of the light engine 110 with both the emitters 108 and the template PCB 110 mounted thereon. The template PCB 110 can be mounted to the heat sink 102 using, for example, screws and one or more alignment/attachment features, such as the alignment/attachment feature 110d. The emitters 108 and template PCB 110 can be mounted in any combination or order. For example, the emitters 108 and PCB 110 can be attached to one another prior to mounting the combination thereof on the heat sink 102. Alternatively, the emitters 108 can be mounted on the heat sink 102, such as on mount pads such as the mount pads 106, and then the PCB 110 can be mounted to the heat sink 102 over and/or around the emitters 108. In another mounting method, the emitters 108 can be mounted after the template PCB 110. In this embodiment, the template PCB 110 can serve as a template for placement of the emitters 108, which can be particularly applicable to other embodiments that do not have mount pads.

The alignment/attachment feature 110d can serve the dual purpose of ensuring the alignment of the template PCB 110 is proper as well as partially or wholly connecting the template PCB 110 to the heat sink 102 using, for example, a male/female connection, snap connection, threaded connection, slot connection, or other connection means. Some embodiments of PCB and board assemblies and methods of fabricating and/or attaching boards to heat sinks are described in commonly assigned U.S. patent application Ser. No. 12/947,267 to Lopez et al. and entitled "Board Assemblies, Light Emitting Device Assemblies, and Methods of Making the Same", which is fully incorporated by reference herein in its entirety.

In the embodiment shown in FIGS. 9A-10D, the top of the emitters 108 can define a plane lower than the top of the template PCB 110, but high enough such that no light from the emitters 108 intercepts the PCB 110. This can provide some mechanical protection to the emitters 108. FIG. 11 shows an alternate embodiment of the spatial relationship between the emitters 108' and the PCB 110', although embodiments other than those shown in FIGS. 9A-9C and 11 are possible. In the FIG. 11 embodiment, the top of the emitters 108' can define a plane approximately even with or above the top of the PCB 110'. In embodiments of the present invention, the bottom surfaces of the emitters 108 can define a plane even with or below the top surface of the PCB 110, and/or can define a plane even with or below the bottom surface of the PCB 110. These arrangements and the arrangements described above can also reduce emission losses or unevenness. Further, surfaces of the template PCB and the heat sink 102, such as the bottom surfaces facing the direction of emission, can comprise a reflective material that can redirect light that has been reflected back into the light engine 100.

The template PCB 110 can include means for electrically connecting one or more emitters 108 to one or more other emitters 108, such as by traces between the emitters 108 which can be on the top surface of the PCB 110 (not shown). The traces can be copper or other conductive materials known in the art. The connections between PCB traces and emitters (such as the emitter contact portion(s)) can be easier to fabricate than prior art methods which require, for example, wire bonding. These traces can be provided before or after attaching the emitters 108 to the PCB 110. Sections of the template PCB 110 can be on or over portions of the emitter substrates 108b which do not include part of an emitting portion 108a. For example, as seen in FIG. 9C, part of the PCB 110 can be on one or more portions of the emitter 108, but not covering the emitting portion 108a. As seen in FIG. 9A, an entire emitting portion 108a can be exposed through a cut-out 110b. In the embodiments of FIGS. 9A-9E and 10, each of the emitters can include two top-side contacts. Emitters that can be used in embodiments of the present invention can have zero, one, two, or more top-side contacts, although in a preferred embodiment utilizing the template PCB 110 the emitters have one or more such contacts.

Portions of the template PCB 110 can be used to make electrical connections to the emitter 108, such as to the contacts 108c. Because the emitters 108 can be arranged level with or below a top surface of the PCB 110, the electrical connections provided by the PCB 110 can be on its top surface (as compared to, for example, a prior art PCB using conductive vias to make an electrical connection from the bottom of the PCB). The template PCB 110 can include conductive portions or fingers 110a for this purpose.

Figure 10D:
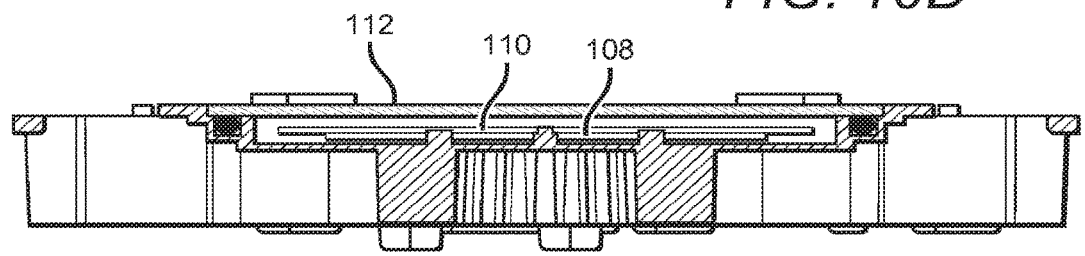
FIGS. 10A-10D are a bottom perspective view and three cut-away views, respectively, of one embodiment of a light engine according to the present invention.
Figure 10A:
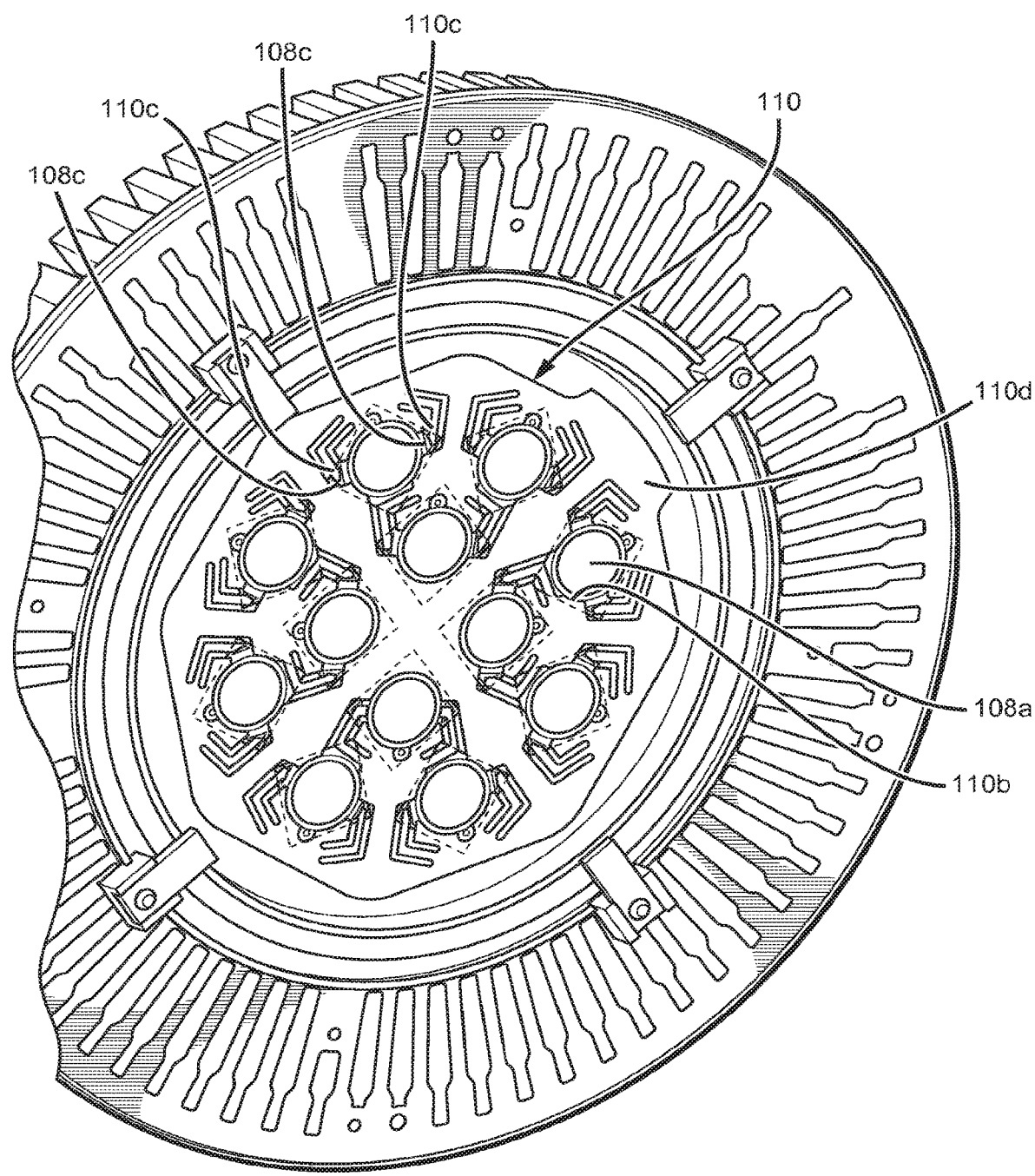
Figure 10B:
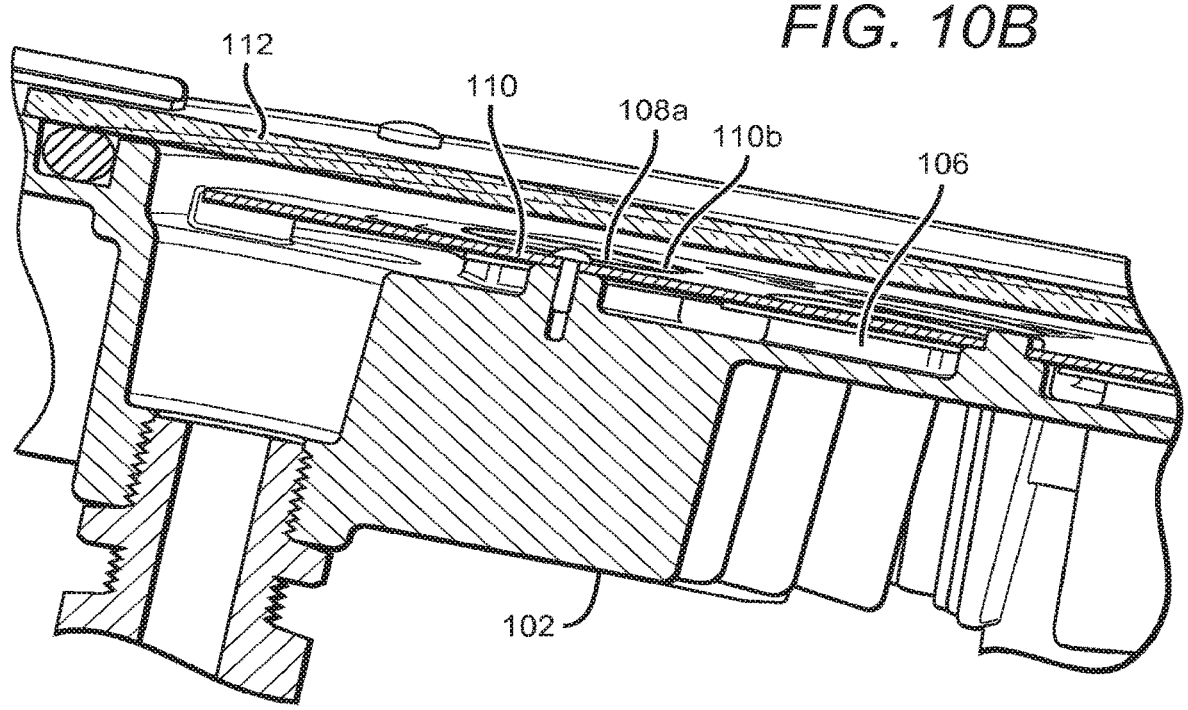
Figure 10C:
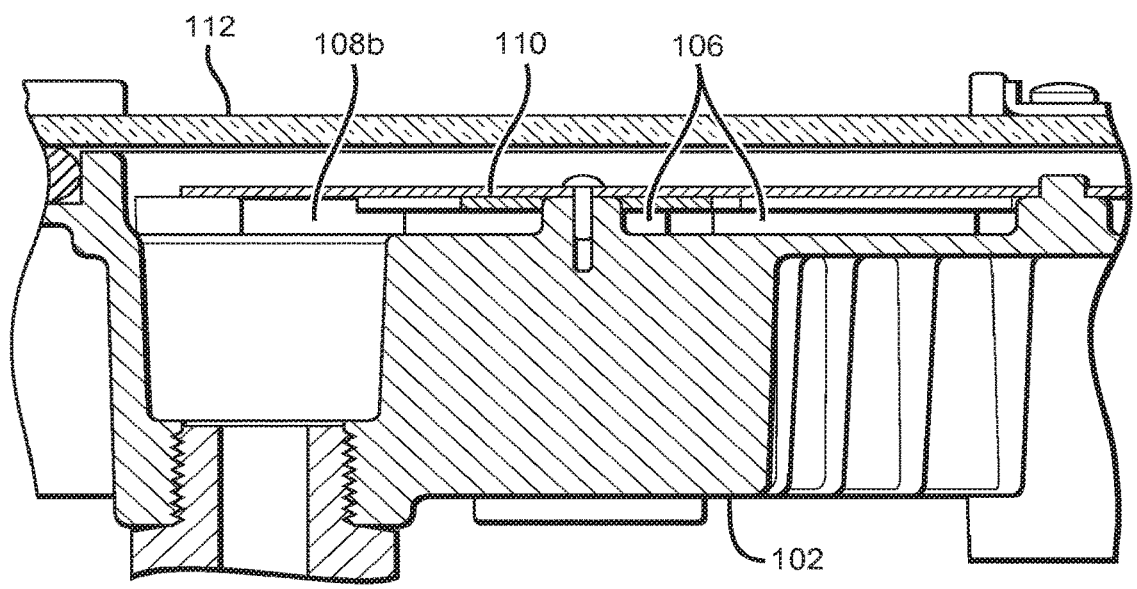
Figure 12A:
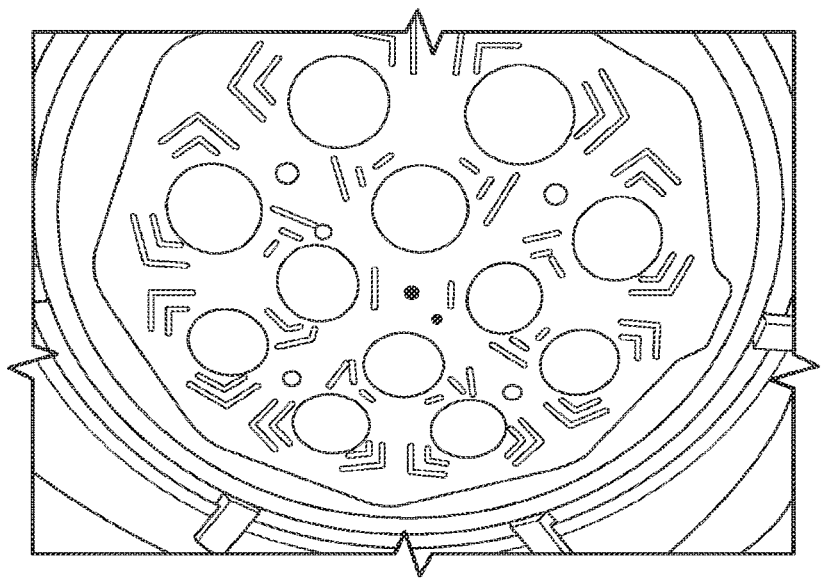
FIGS. 12A and 12B are bottom perspective and bottom view photographs, respectively, of one embodiment of a light engine according to the present invention.
Figure 12B:
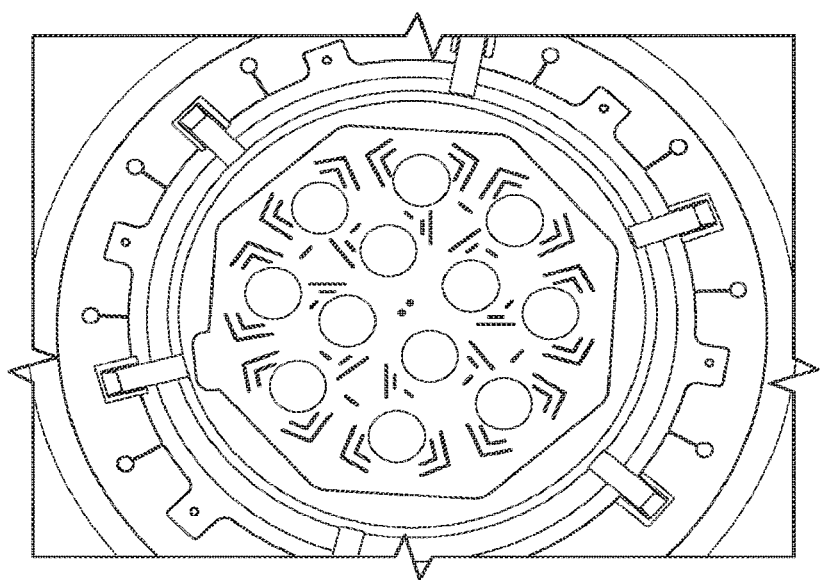

As best shown in FIGS. 9A and 10A and the alternate embodiment of FIG. 11, the fingers 110a/110a' can be over and/or partially or completely cover each of the contacts 108c or 108c'. For example, in FIG. 11 the left finger 110a' can extend to the perimeter of the emitting portion 108a', while the right finger 110a' can only partially cover its respective contact 108c'. Embodiments can have one or both of these configurations, or other configurations.

Figure 5:
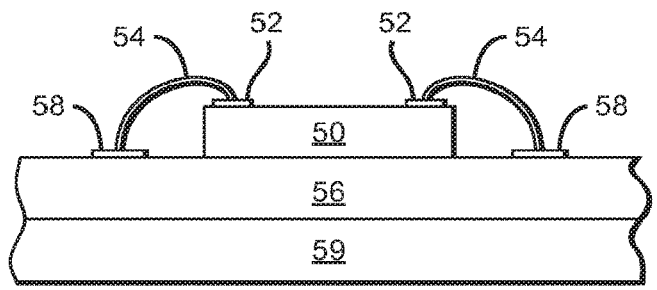
FIG. 5 is a cross-sectional view of a prior art light emitter on a prior art circuit board.
Figure 6A:
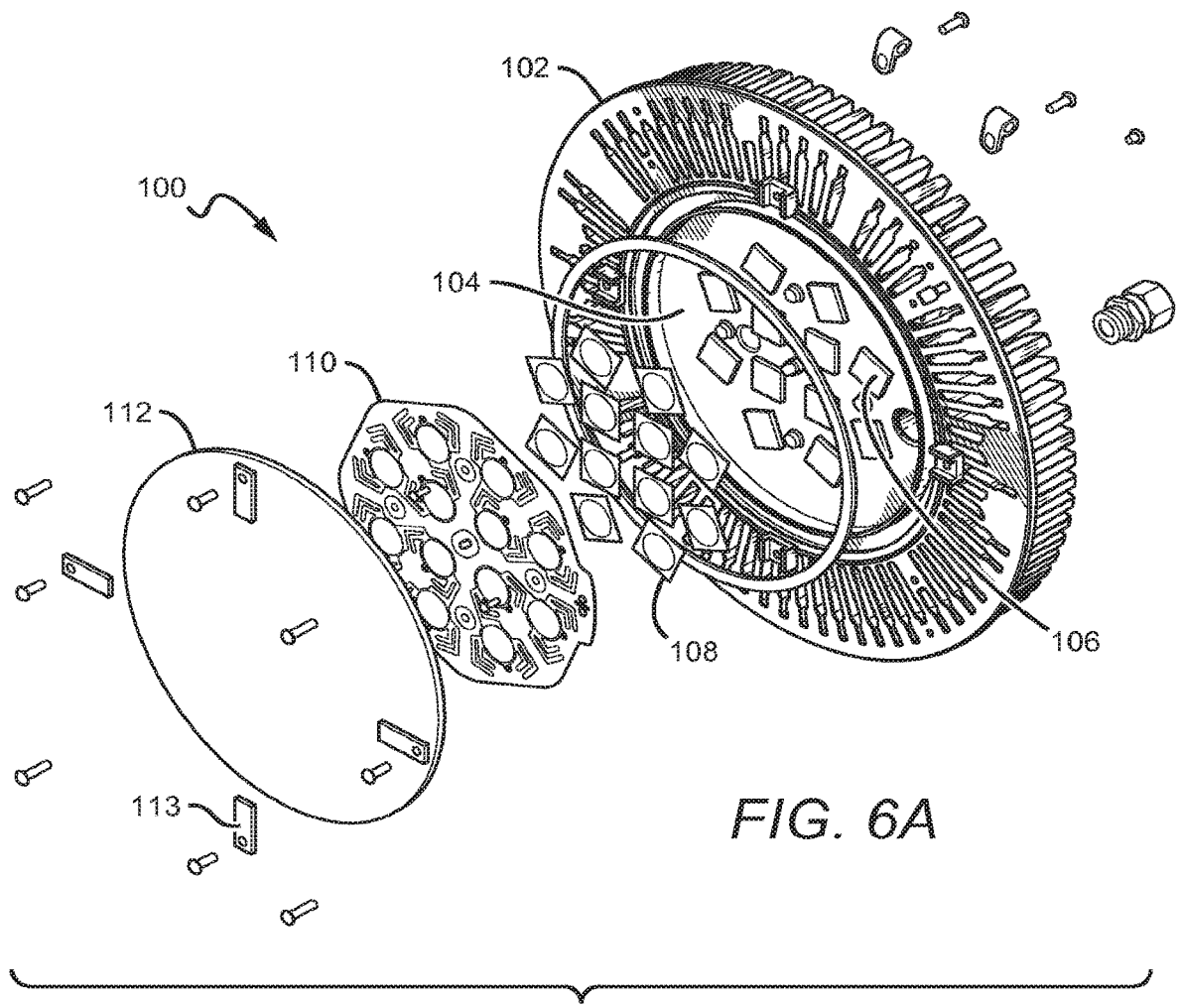
FIGS. 6A-6D are exploded perspective, bottom, side, and top views, respectively, of a light engine according to one embodiment of the present invention.
Figure 6B:
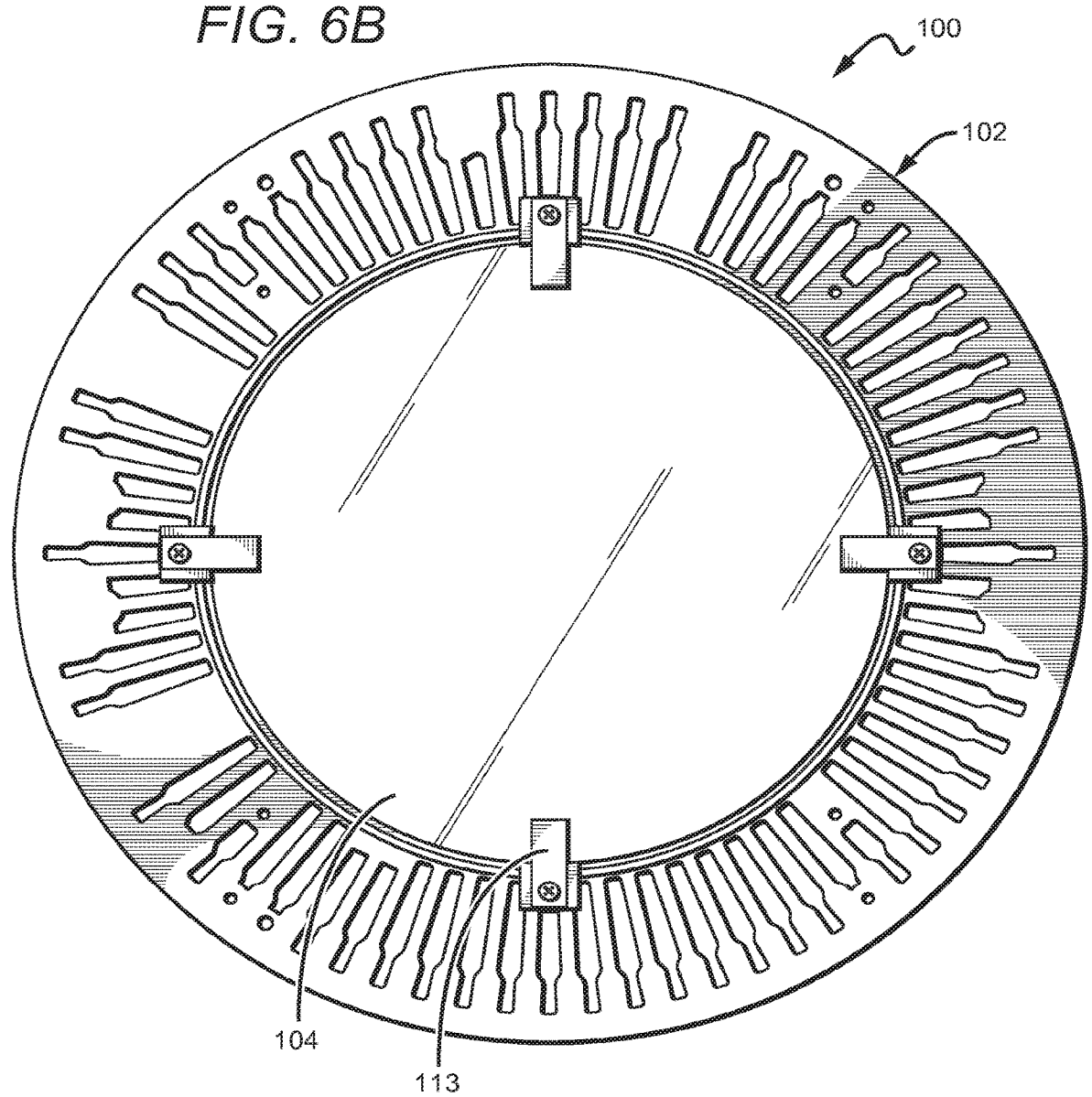
Figure 6C:
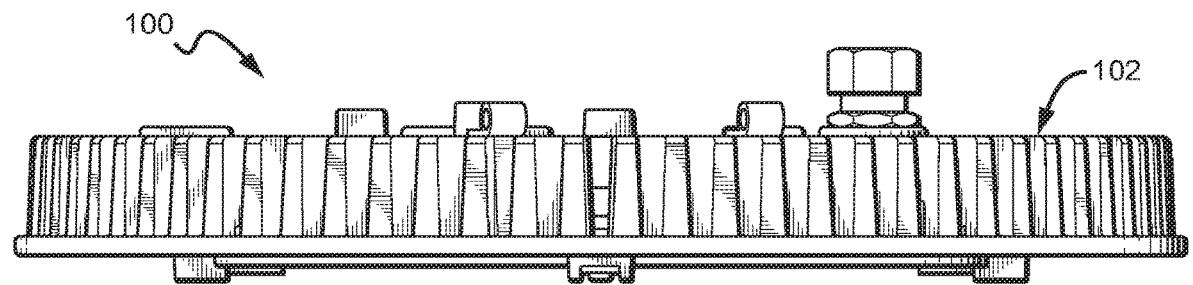
Figure 6D:
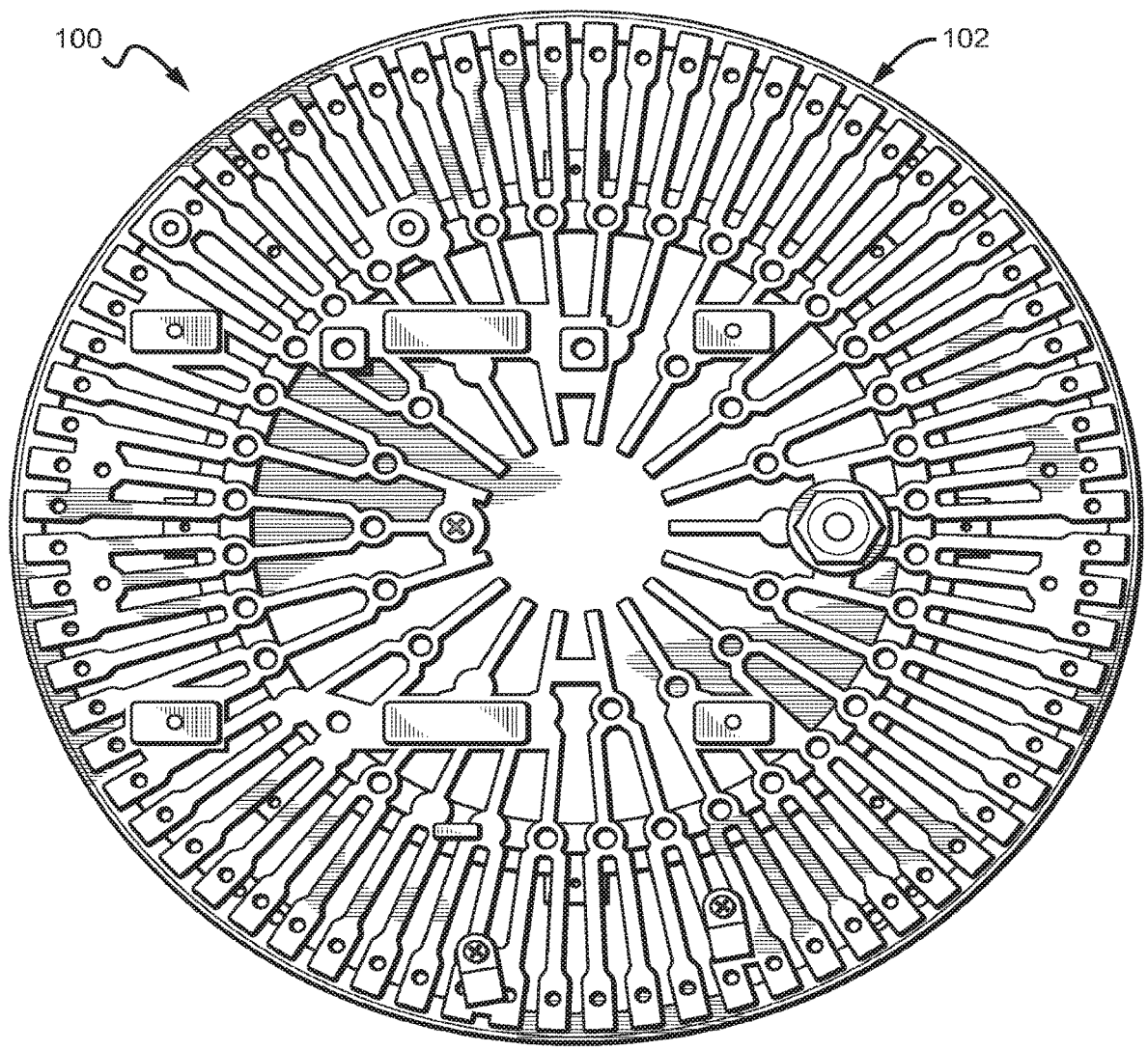

The use of fingers can simplify manufacturing by enabling quick connections to be made to the emitters 108, such as to the contacts 108c. In one method of fabrication, the template PCB 110 can be placed over and/or around the emitters 108 such that a finger 110a is over each of the contacts 108c. The fingers 110a/110a' can include a solder pad, such as an HASL solder pad, on its tip. Each finger 110a/110a' can then be electrically connected to its respective contact 108c/108c' by soldering or welding, which is far less labor intensive and more reliable than wirebonding to traces as shown in FIG. 5. Alternatively, all of the fingers 110a/110a' (in one embodiment, twenty-four total fingers for twelve emitters) can be attached to their respective contacts at the same time using hot bar soldering, as is known in the art. Whether connected individually or as a group such as by using hot bar soldering, the connection process is much less labor intensive than traditional connection methods. While the above embodiments describe solder connections, many other types of electrical connections as known in the art can be used.

Some areas of the PCB 110 can be devoid of any connection means such as copper tracks for compliance reasons. For example, as best shown in FIG. 9A, one or more of the areas 110e of the PCB 110 can be left devoid of traces. These areas can be calculated. For example, in one embodiment screws can be placed through the areas 110e to provide a connection to the heat sink 102. In this embodiment, copper tracks on the PCB 110 can be operating at 220V with the heat sink 102 grounded, meaning that a distance of about 3.2 mm should remain between the screw (connected to the heat sink 102) and any traces. The areas 110e can be designed to meet these and similar specifications.

The emitters 108 can be electrically connected in any combination of series and/or parallel connections, such as by traces. The wires can then be connected to a power supply unit and/or a driver unit, such as those described and shown in the applications incorporated by reference in the first two paragraphs of the detailed description. In the light engine 100, two strings of six series-connected emitters 108 can be connected to one another in parallel. The cross-section of the PCB 110 (such as the location of the features fingers 110a, cut-outs 110b, slots 110c, and/or alignment/attachment feature 110d, the layout of the traces or other means electrically connecting the emitters 108, and/or the drive signal can be changed to accommodate any type of connection between the emitters 108. Some single string LED circuits are described in commonly assigned U.S. patent application Ser. No. 12/566,195 to van de Ven et al. and entitled "Color Control of Single String Light Emitting Devices having Single String Color Control", and commonly assigned U.S. patent application Ser. No. 12/704,730 to van de Ven et al. and "Solid State Lighting Apparatus with Compensation Bypass Circuits and Methods of Operation Thereof", each of which is fully incorporated by reference herein in its entirety.

In the prior art, PCBs with emitters mounted thereon should have good thermal conductivity in order to dissipate heat from the emitters. In one such example, an expensive MCPCB or FR-4 board is used. For example, the use of various circuit boards with Cree® XLamp® LEDs is described in the technical article "Optimizing PCB Thermal Performance for Cree® XLamp® LEDs" (available at http://www.cree.com/xlamp_app_notes/PCB Thermal), which is fully incorporated by reference herein in its entirety. In the light engine 100, however, the emitters 108 can be mounted directly on the heat sink 102 without the intervening PCB, since the template PCB 110 is mounted over and/or around the emitters 108. Thus, no expensive thermally conductive materials or complex machining of conductive vias is necessary. Further, other than specific connection means such as copper tracks and solder pads which serve to electrically connect various elements, the PCB 110 can be made of materials which are thermally insulating, which can be cheaper than thermally conductive materials such as those present in an MCPCB.

The above devices and/or methods can allow for mounting of types of emitters which may not be suited for prior art methods, such as methods utilizing high temperatures. For example, one prior art method of mounting emitters on a circuit board is surface mount technology which can employ high temperatures, such as temperatures of 200.degree. C. or above, or 260.degree. C. or above. Some emitters, including some high intensity emitters such as those that can be used in high bay lighting, can experience damage or destruction at these temperatures. The present mounting methods, on the other hand, can allow for mounting of an emitter directly on a heat sink using an adhesive, and a simple solder process to electrically connect an emitter to a circuit board. These processes do not necessitate the use high temperatures such as those discussed above. As such, the emitter can be mounted with little to no damage and/or significantly less damage than would have been caused by a high temperature method such as those described above.

Figure 3A:
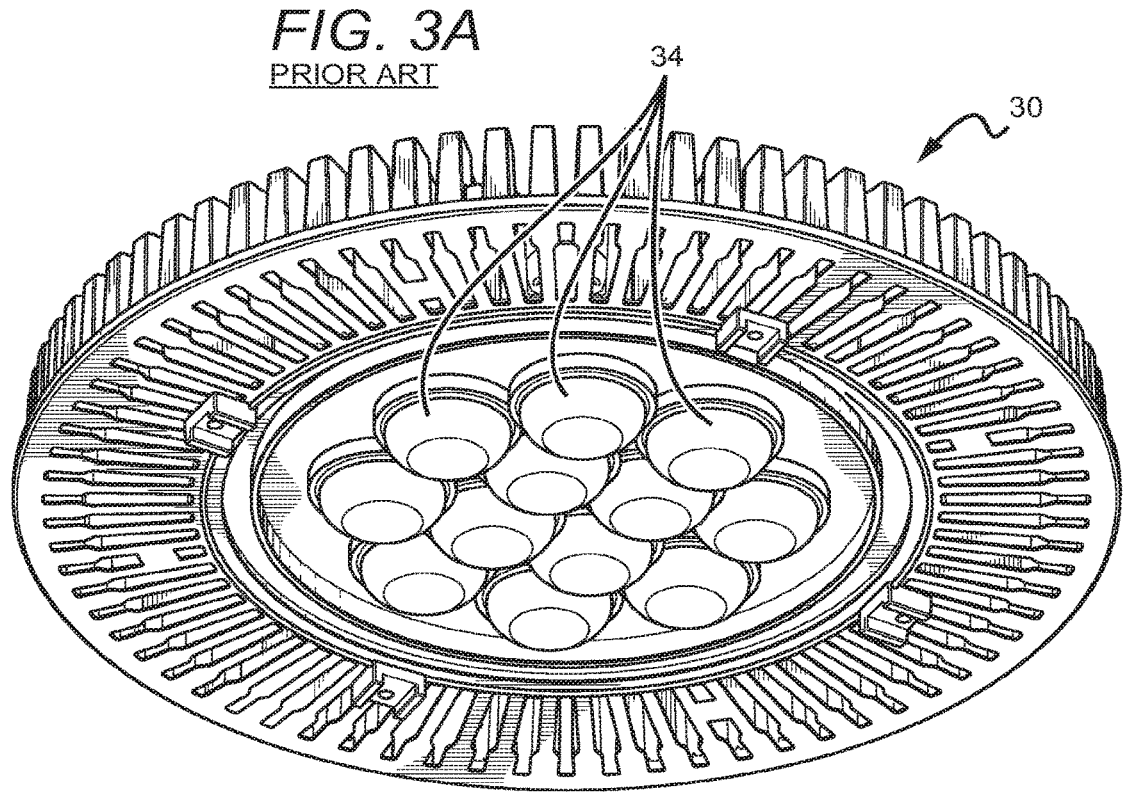
FIGS. 3A and 3B are a bottom perspective view and an intensity distribution plot, respectively, of yet another prior art high bay lighting fixture.
Figure 3B:
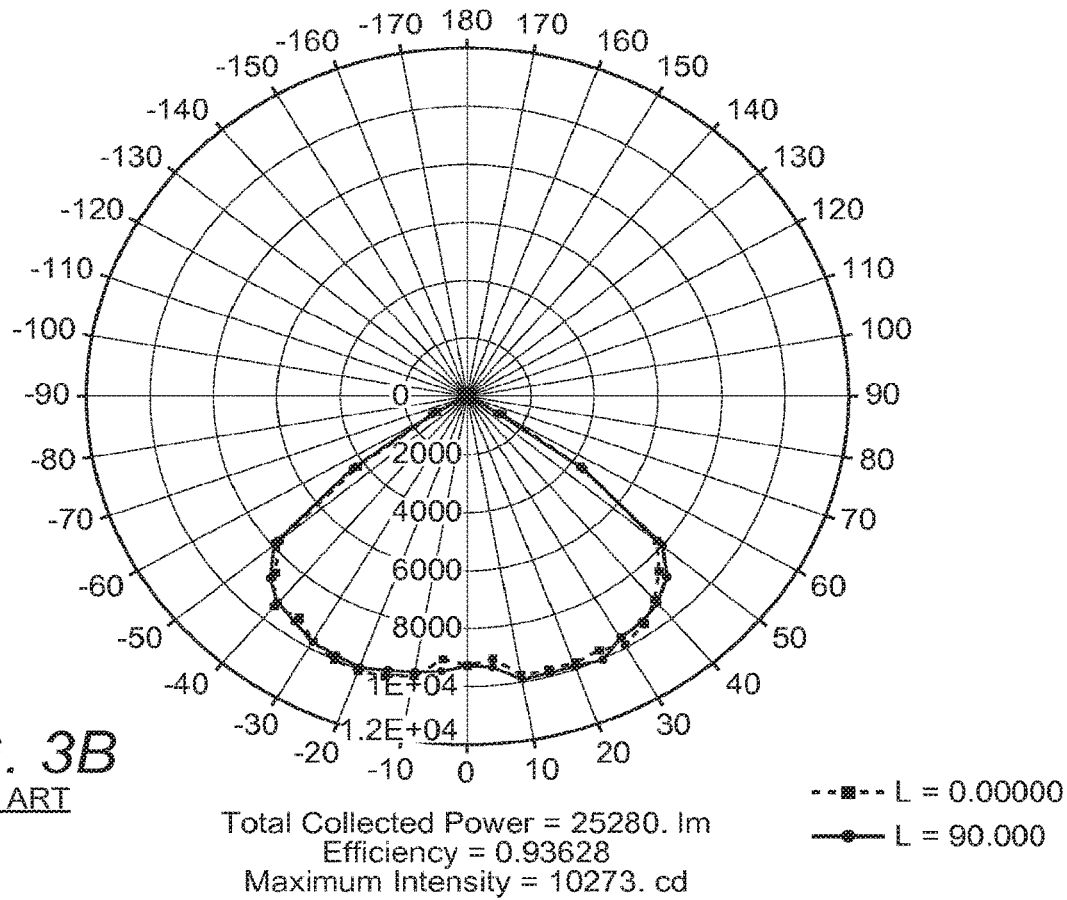
Figure 4A:
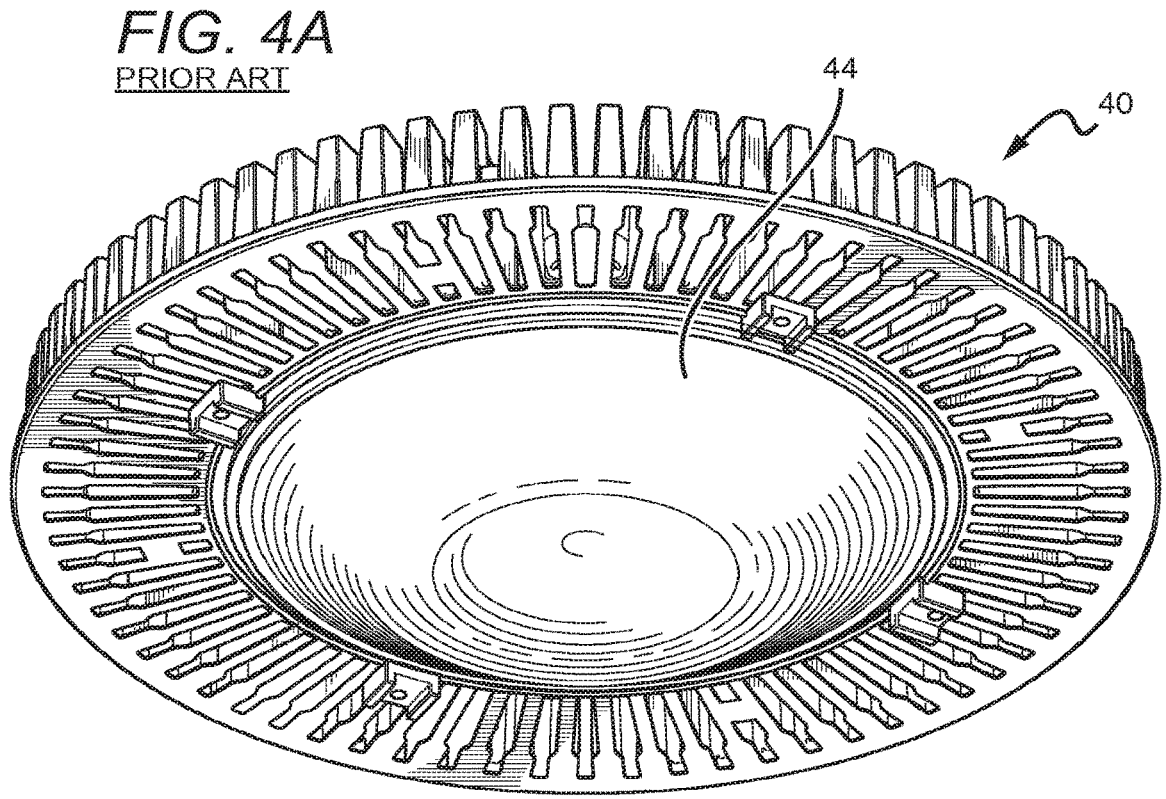

Prior art high bay fixtures often include expensive and complex optics, such as the individualized lenses 24 shown in FIG. 3 and the shaped lens shown in FIGS. 4A and 4B. As described above, these optics are often included in a fixture in order to increase the spacing criterion (SC) of a fixture to a desired level. However, this increase in SC can come at the expense of added glare, reduced efficiency, added cost, and/or a decrease in aesthetic desirability. The present invention is directed toward methods and devices for achieving a satisfactory or even high SC without sacrificing these factors. This goal can be achieved, for example, through a combination of emitter arrangement, a lens that can be inexpensive, a shaped reflector, and/or other design elements.

FIGS. 13A-13D are bottom perspective, top perspective, side, and bottom views of a high bay fixture 200 according to the present invention. The high bay fixture 200 can include a light engine such as the light engine 100 described above, although many different light engines are possible.

As best seen in FIGS. 6A, 6B, and 10B-11, the high bay fixture can include a lens such as the flat and/or planar lens 112 (referred to herein simply as a "flat lens"). Other lenses are possible. The flat lens 112 can have at least three distinct advantages over prior art SSL high bay lenses such as the lens arrangements seen in FIGS. 3 and 4A and 4B. First, the lens is much less costly. Second, prior art SSL fixtures can experience unsatisfactory levels of glare; the use of a flat lens can reduce glare. Finally, the flat lens 112 can have aesthetics similar to a prior art non-SSL high bay fixture, which can be desirable.

The lens 112 can be mounted at any distance over the emitters 108. In some embodiments, this distance can be dictated in part by a desired ratio between the emitter-lens distance the spacing of the emitters in an array. The mounting height of lenses, including the mounting height in relation to the spacing of an emitter array, is discussed in detail in commonly assigned U.S. patent application Ser. No. 13/842,307 to Ibbettson et al. and entitled "Low Profile Lighting Module", which is fully incorporated by reference herein in its entirety. The distance from the emitters 108 to the lens 112 can be, for example, between about 1 mm and about 10 mm and/or between about 2 mm and about 6 mm, although embodiments with spacings smaller than and larger than this range are possible. FIG. 10D shows one exemplary spacing between the emitters 108 and the lens 112, which is about 4 mm or about 4.05 mm. Many other smaller and greater distances are possible.

In some embodiments, the lens 112 can be textured. A textured lens can have reduced glare over a non-textured lens and/or can be less costly than either of the lens arrangements seen in FIGS. 3 and 4A and 4B. Textured lenses are described in detail in commonly assigned U.S. patent application Ser. No. 13/442,311 to Lu et al. and entitled "Optical Element Including Texturing to Control Beam Width and Color Mixing", which is fully incorporated by reference herein in its entirety. Lenses can also include other materials such as dispersers and/or scattering particles. Some lenses using such features are described in commonly assigned U.S. patent Ser. No. 13/758,763 to Leung et al. and entitled "Solid State Lamp with Light Directing Optics and Diffuser", which is fully incorporated by reference herein in its entirety.

Referring back to FIGS. 6A, 7A, and 7B, the fixture 200 can include emitters arranged in a specific manner to achieve a desired output and/or increase SC. While achieving a desirable SC is one priority, a high bay fixture must still achieve minimal luminosity requirements. In the specific arrangement shown, the fixture 200 includes twelve emitters 108, although fewer or more emitters can be used. Fixtures according to the present invention, such as the fixture 200, can achieve an output of approximately 18,000 lumens or more and/or an efficacy of approximately 90 lm/W or more. In a preferred embodiment, the fixture 200 can produce an output of approximately 23,000 lumens or more and/or an efficacy of approximately 100 lm/W or more.

The emitters 108 can be arranged in a single arrangement, and/or can include two or more subarrangements, each of which can contain any number of emitters. In the specific case shown in FIG. 7B, the array can be arranged such that a first subarrangement 208a is formed by four emitters with their centers evenly spaced on circle of a first diameter, and a second subarrangement 208b is formed by eight emitters with their centers evenly spaced on a circle of a second diameter. In this embodiment the subarrangements 208a, 208b can form an inner and outer ring, but many other arrangements, including non-circular arrangements, are possible. Circular arrangements can provide for a more omnidirectional array emission, which can increase SC. In the embodiment shown, the ratio of emitters in the subarrangement 208a to the subarrangement 208b is 1:2. Some other emitter ratios can be 1:4, 2:3, and 3:4, although other higher and lower ratios are possible. In the embodiment shown the ratio of inner ring diameter (46 mm) to outer ring diameter (100 mm) is approximately 1:2 or slightly under 1:2. In other embodiments, this ratio can be lower than 1:2, such as a ratio of approximately 1:4 or greater. In other embodiments, this ratio can be higher than 1:2, such as 2:3, 3:4, or higher.

While the array shown in FIG. 7B includes subarrangements 208a, 208b which form inner and outer rings, many other arrangements are possible. Some arrangements according to the present invention can include a single ring, three or more rings, oval shaped rings, one oval ring and one circular ring, rings with polygon shapes, and so on. Many different arrangements are possible.

The actual spacing of the emitters 108 can vary based on, for example, the number of emitters used, the desired emission profile (e.g., more down-directed light vs. more high angle light), the type of emitter used, the total size of the fixture, thermal dissipation considerations, physical fit, and many other factors. The spacing of emitters in fixtures, such as the emitters 108, is discussed in detail in U.S. patent application Ser. No. 13/842,307 to Ibbettson et al. In one embodiment, the spacing of the emitters 108 is proportional to the dimensions of a reflector; this relationship will be discussed in detail below.

Figure 13A:
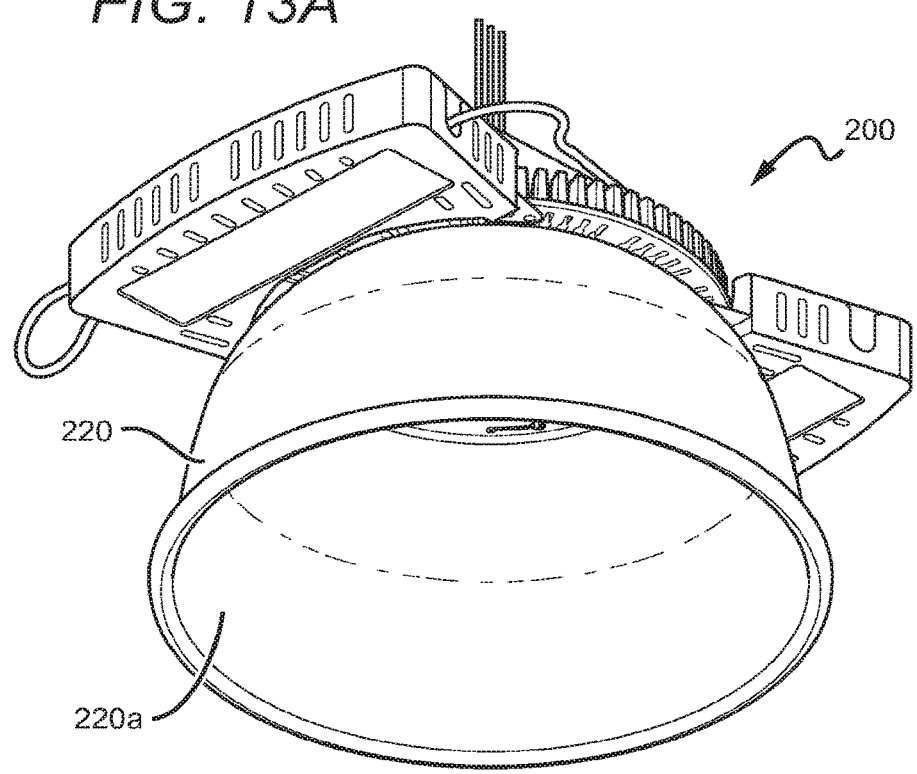
FIGS. 13A-13G are a bottom perspective view, a top perspective view, a side view, a bottom view, an exemplary dimensioned partial side view, an intensity distribution plot, and a ray trace, respectively, of one embodiment of a high bay fixture according to the present invention.
Figure 13B:
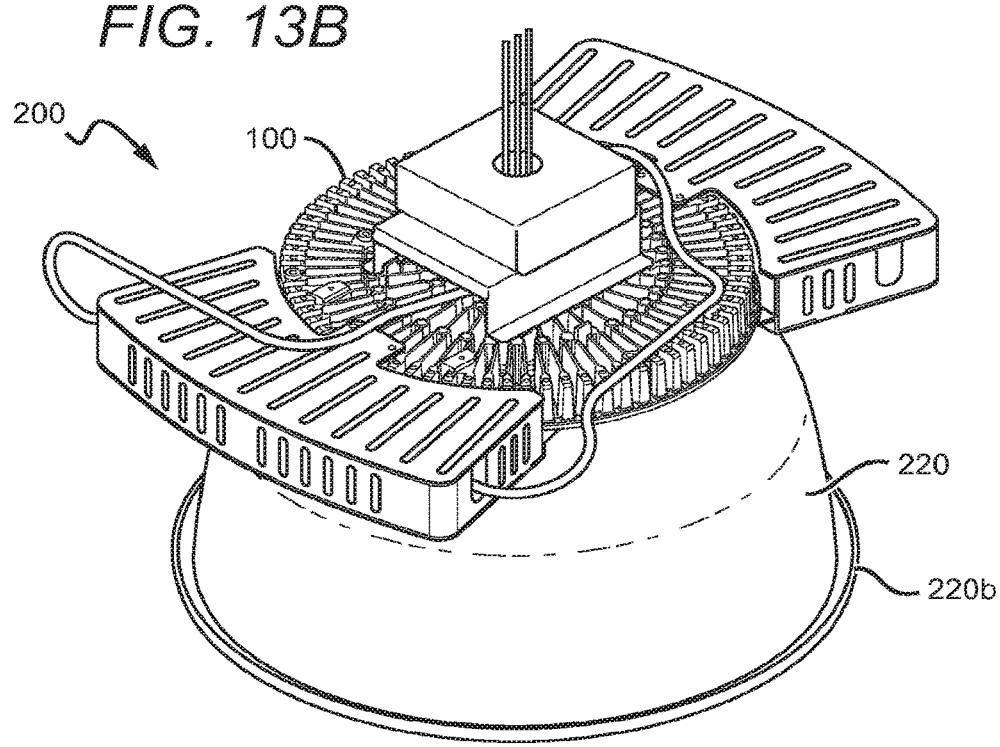
Figure 13C:
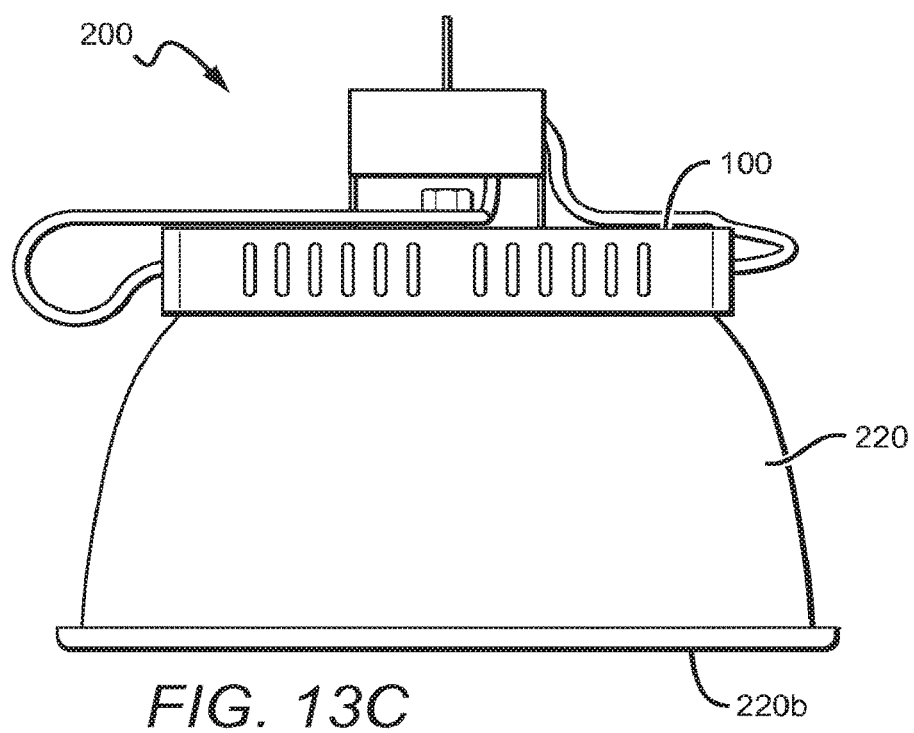
Figure 13D:
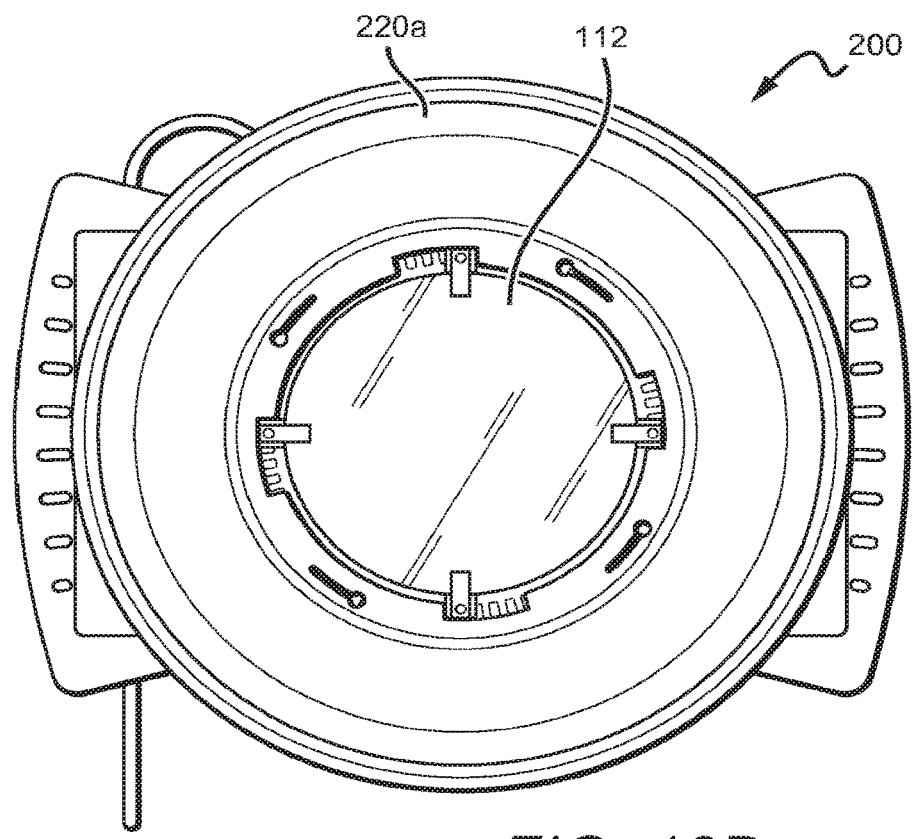
Figure 13E:
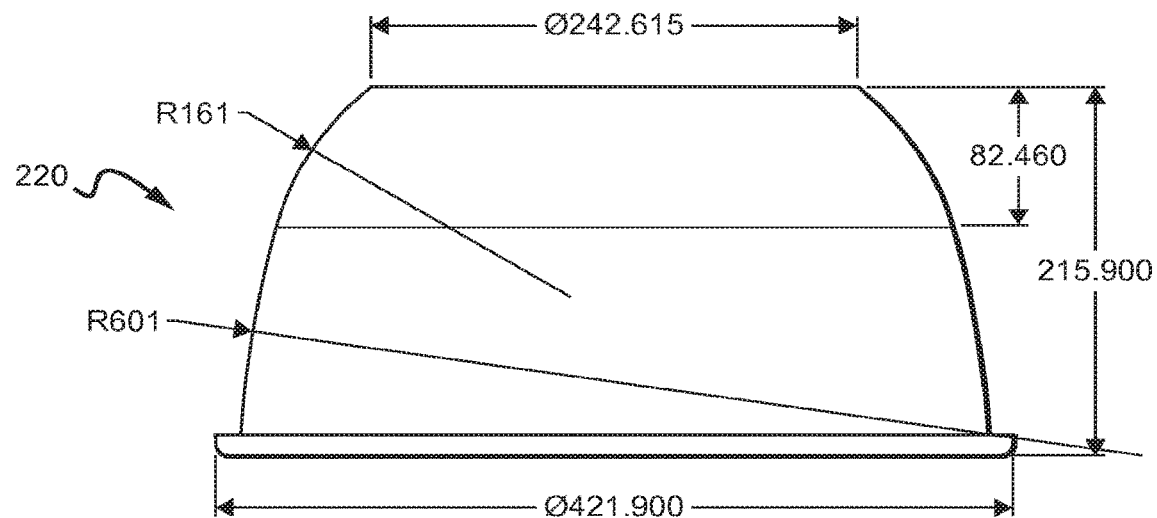

As previously stated, traditional solid state high bay fixtures often do not include reflectors which are common in non-SSL high bay fixtures. Referring back to FIGS. 13A-E, fixtures according to the present invention such as the fixture 200 can comprise a reflector, such as the reflector 220. A dimensioned side view of one exemplary embodiment of a reflector 220 is shown in FIG. 13E. The reflector 220 can be shaped specifically to improve the SC of the device, and can work in conjunction with, for example, the layout and emission profiles of the emitters 108, a lens 112 which will be discussed in detail below, and/or other elements to achieve this goal. The reflector 220 can include a bottom lip 220b which can increase mechanical strength.

The reflector 220 and the other reflectors described herein can have various dimensions. FIGS. 13A-15E show dimensions and other characteristics of exemplary embodiments of reflectors according to the present invention. These dimensions and characteristics are in no way limiting, as various dimensions can be used to achieve similar or different emission characteristics. Further, the different sets of dimensions disclosed in each reflector embodiment are not limited solely to that embodiment (for instance, the ratio of lower arc radius to upper arc radius described in relation to the reflector 220 from FIGS. 13A-13G can be substituted into a reflector having all the other dimensions of the reflector 222 from FIGS. 14A-14E, and so on).

The reflector 220 can have a profile defined by one or more arcs. As best shown in FIG. 13E, in this specific embodiment the reflector can have a profile defined by two arcs, such as a high radius lower arc and a low radius upper arc (although these can be reversed). In this case, the radius of the lower arc can be approximately 3.5 or 4 times the radius of the upper arc, although smaller and larger ratios are possible, such as ratios of under 1 and ratios of about 2, 5, 10, 30, or more. The transition between the arcs can be approximately ⅔ up the height of the reflector, though as will be seen in other embodiments, this transition point can be higher or lower, such as about 60% up the height of the reflector or about ¾ up the height of the reflector. In the specific embodiment shown, the transition point can be about 62% up the height of the reflector. The top width of the reflector 220 can be approximately 60% of the bottom width, although other embodiments are possible. When used in combination with the specific light engine layout shown in FIG. 7B, the ratio of the top diameter of the reflector 220 to the width of the array of emitters 108 can be approximately 5:2, although higher and lower ratios are possible. Similarly, the ratio of the bottom diameter of the reflector 220 to the width of the array of emitters 108 can be approximately 4:1, and/or the ratio of the height of the reflector 220 to the width of the array of emitters 108 can be approximately 2:1, although higher and lower ratios are possible in both of these cases.

Many different types of reflective materials can be used for the inner surface 220a of the reflector 220. In one embodiment, the reflective surface 220a can comprise aluminum, such as the surface of a reflector made of aluminum or an aluminum coating, for example. The reflective material can be highly reflective in the wavelength ranges of the light sources. In some embodiments, the reflective surface 220a can be 75% or more reflective, or can be approximately 80% reflective. In other embodiments it can be 90% or more reflective. In other embodiments, it can be at least 93% reflective, at least 95% reflective, at least 97% reflective, and/or at least 99% reflective.

In one embodiment, the reflective surface 220a can be slightly specular and/or more specular than diffuse. The use of a specular reflector can provide greater control over the emission profile than if a diffuse surface is used. In other embodiments, the reflective surface 220a can be entirely specular or nearly entirely specular. Diffuse reflectors can also be used, and are particularly applicable to embodiments of the present invention using emitters that emit different wavelengths since diffuse reflectors can achieve better color mixing than specular reflectors.

The reflective surface 220a can also be textured to, among other functions, reduce imaging and/or glare from the light sources. In one embodiment, the reflective surface 220a comprises micro-mixing optics. In some embodiments, the texturing can be imparted to the reflective surface 220a by imprinting. In another embodiment, it can be imparted by roughening. As in the case of imprinting, polycarbonate can be used. Also as in the case of imprinting, the intensity of the roughening can vary spatially relative to the center of the reflector and/or the positioning of the light source. The roughening can be accomplished in a number of different ways, regardless of whether the reflector is initially made by extrusion or by some other method. Textured reflectors are described in U.S. patent application Ser. No. 13/345,215 to Lu et al. and entitled "Light Fixture with Textured Reflector," and micro-optics and optical texturing are described in U.S. patent application Ser. No. 13/442,311 to Lu et al. and entitled "Optical Element Including Texturing to Control Beam Width and Color Mixing", both of which are commonly assigned with the present application and both of which are fully incorporated by reference herein in their entirety. This type of texturing can also be used, for example, on optical elements such as the lens 112. Some examples of reflective surfaces that can be used and/or texturing that can be used in embodiments of the present invention are those produced by Nata® Lighting Company of China for Cree®, Inc., and described in the Nata® "Cree Reflector Leaflet," revision 7 (available at http://www.nata.cn/images/newsletter/pdf/Cree %20Leaflet %20%28rev-7%29.pdf-, retrieved Dec. 11, 2013) which is fully incorporated herein by reference in its entirety.

Figure 2:
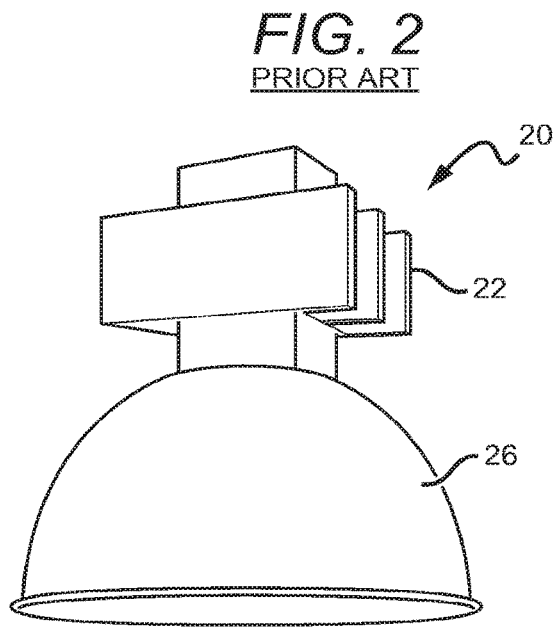
FIG. 2 is a bottom perspective view of another prior art high bay lighting fixture.
Figure 13F:
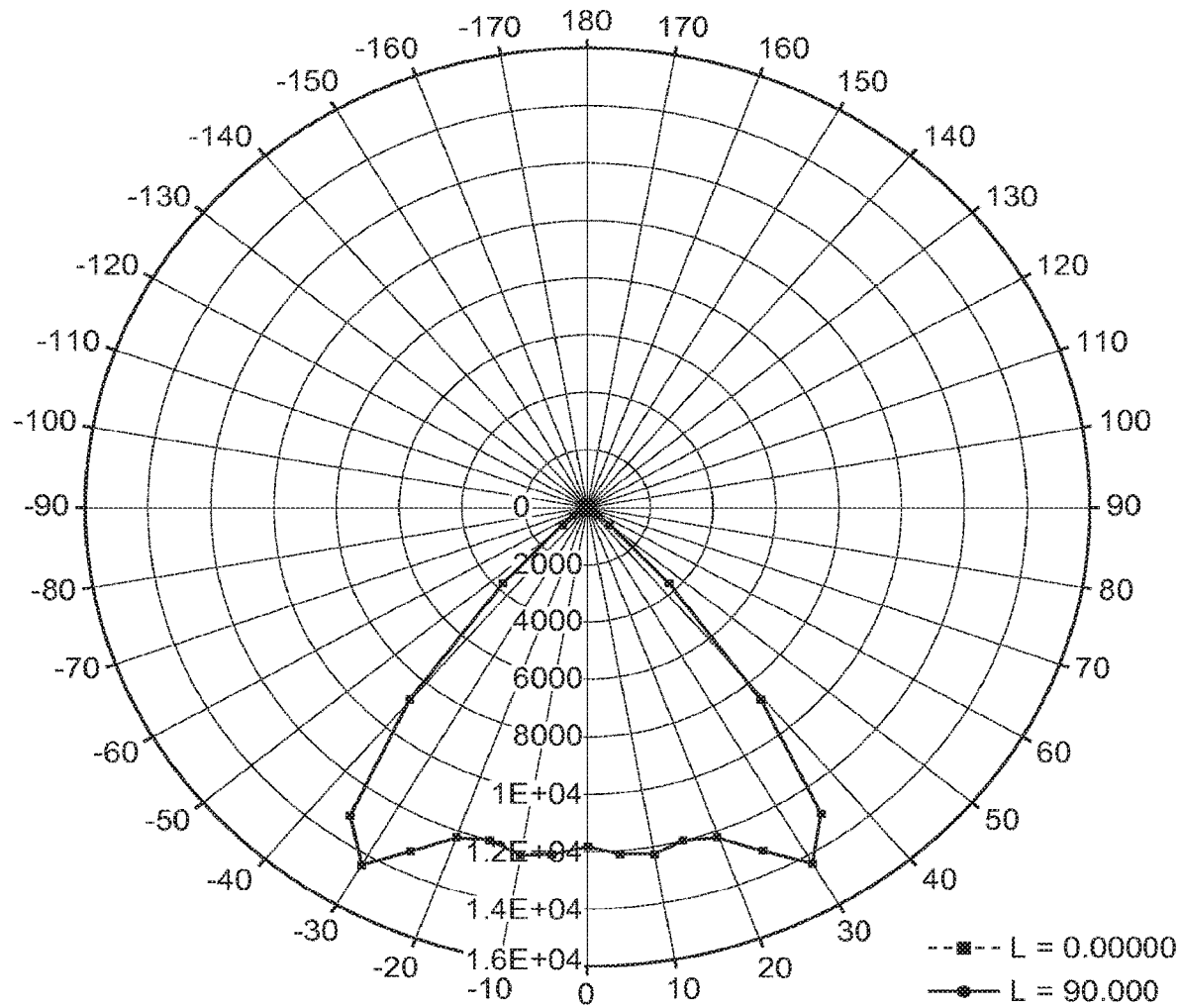
Figure 13G:
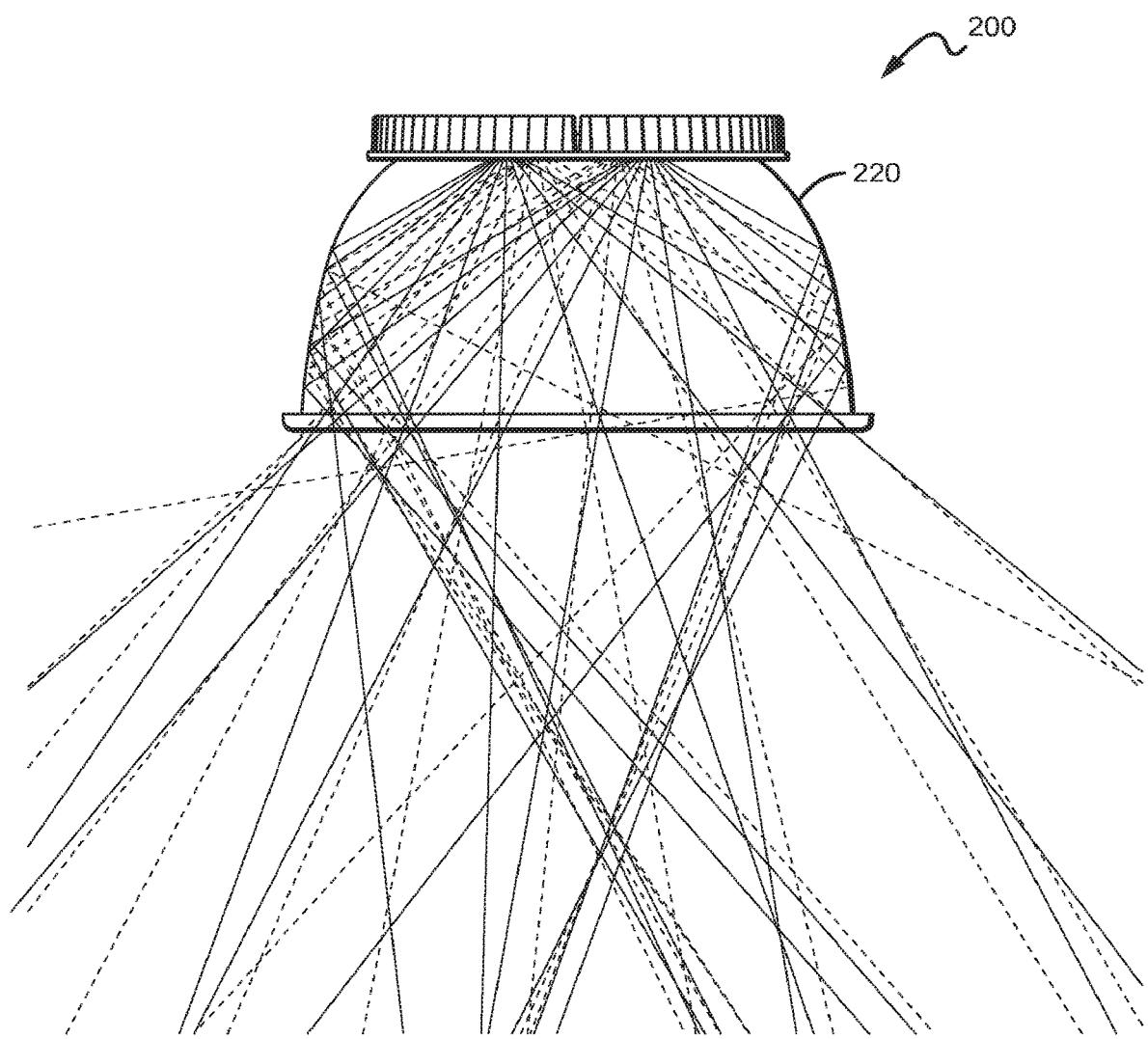

While maximizing SC can be one design goal, other situations call for a "hybrid fixture" which can be employed in a variety of lighting applications. Typically, aisle lighting employs fixtures with a lower SC in the range of 1.3-1.4, and open-space non-SSL lighting employs fixtures with a higher SC in the range of 1.6-1.7. FIG. 13F shows the emission profile of one specific embodiment of the fixture 200, comprising 1) the layout of emitters shown in FIG. 7B, 2) a flat lens such as the lens 112, and 3) the embodiment of the reflector 220 shown in FIG. 13E, with a slightly specular finish. As can be seen in FIG. 13F, this embodiment of the fixture 200 can have a maximum emission at approximately 30.degree., and/or can have a nadir emission of about 85% of maximum, and/or can have 50% of maximum intensity at approximately 40.degree., and/or can have zero or almost zero light emitted at angles over about 50.degree.. Other output attributes are clear to one of skill in the art from FIG. 13F.

A ray trace of the fixture 200 described above is shown in FIG. 13G, with dashed lines showing light rays produced by the inner emitters and solid lines showing light rays produced by the outer emitters. As can be seen, the percentage of light emitted at high angles can be approximately equal for both the inner and outer emitters, or the inner emitters can emit slightly more high angle light. In other embodiments, the inner emitters can emit more high angle light. In still other embodiments, the outer emitters can emit more high angle light. In this embodiment, some light is directed at approximately 30.degree., while some light is directed at the nadir, although other embodiments are possible.

This particular embodiment of the light fixture 200 has an SC of approximately 1.5, and/or between 1.4 and 1.6, and/or between 1.45 and 1.55. Fixtures with an SC of approximately 1.5 can be used effectively in both aisle and open-space lighting. Fixtures with other combinations of features can also achieve this approximate SC, and thus the above attributes should not be tied solely to the embodiment with the features described above, such as the features 1-3.

FIGS. 14A-14E and 15A-15E are bottom perspective views, side views, dimensioned side views, intensity distribution plots, and ray traces, respectively, of two high bay fixtures 221, 223 according to the present invention. The emission profile and/or output of high bay fixtures can be altered by changing any one of many different elements, including but not limited to the shape of the emitter array, the type of emitter used, the shape and type of lens, the type of reflective surface used, any of the distance proportions described above, etc. The following variations on the above embodiment are made by altering the cross-section of the reflector 220 and holding all other elements constant. However, the reflectors described above and below are not necessary to achieve the fixture attributes described in relation to the described embodiment. For example, the above reflector 220 can be used in combination with various other elements in order to achieve an SC of 1.35 for aisle-specific lighting applications if other elements are altered. Thus, the scope of the disclosure should not be limited to the embodiments specifically described herein.

Figure 14C:
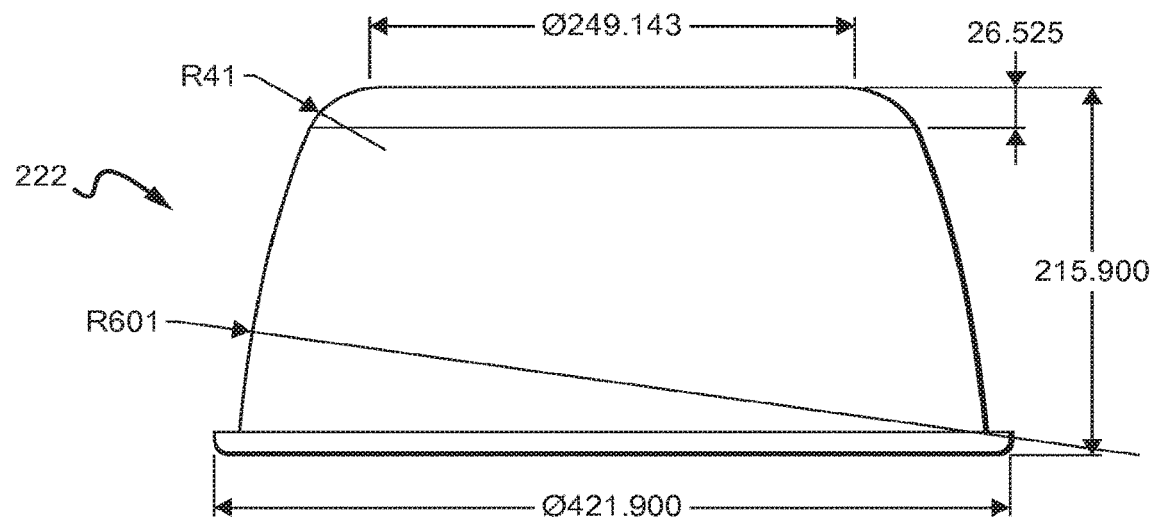

FIGS. 14A-14C show a bottom perspective, side, and dimensioned side view, respectively, of a high bay fixture 221 which can include a reflector 222. The reflector 222 has dimensions different than that of the reflector 220 described above in FIGS. 13A-13G. The reflector 222 can have a profile defined by one or more arcs. As best shown in FIG. 14C, in this specific embodiment the reflector can have a profile defined by two arcs. In this specific embodiment the reflector can have a profile defined by a high radius lower arc and a low radius upper arc. In this case, the radius of the lower arc can be approximately 15 times the radius of the upper arc, although smaller and larger ratios are possible, such as 10 times. The transition between the arcs can be approximately 80% or more up the height of the reflector, though this transition point can be higher or lower, such as 90% or higher. In the specific embodiment shown, the transition point can be approximately 88% up the height of the reflector, although other heights are possible, such as about 85% or higher. The top width of the reflector 222 can be approximately 60% of the bottom width, although other embodiments are possible. Here, the top width is slightly larger than that of the reflector 220. When used in combination with the specific light engine layout shown in FIG. 7B, the ratio of the top diameter of the reflector 222 to the width of the array of emitters 108 can be approximately 5:2, although higher and lower ratios are possible. Similarly, the ratio of the bottom diameter of the reflector 220 to the width of the array of emitters 108 can be approximately 4:1, and/or the ratio of the height of the reflector 220 to the width of the array of emitters 108 can be approximately 2:1, although higher and lower ratios are possible in both of these cases.

Figure 14D:
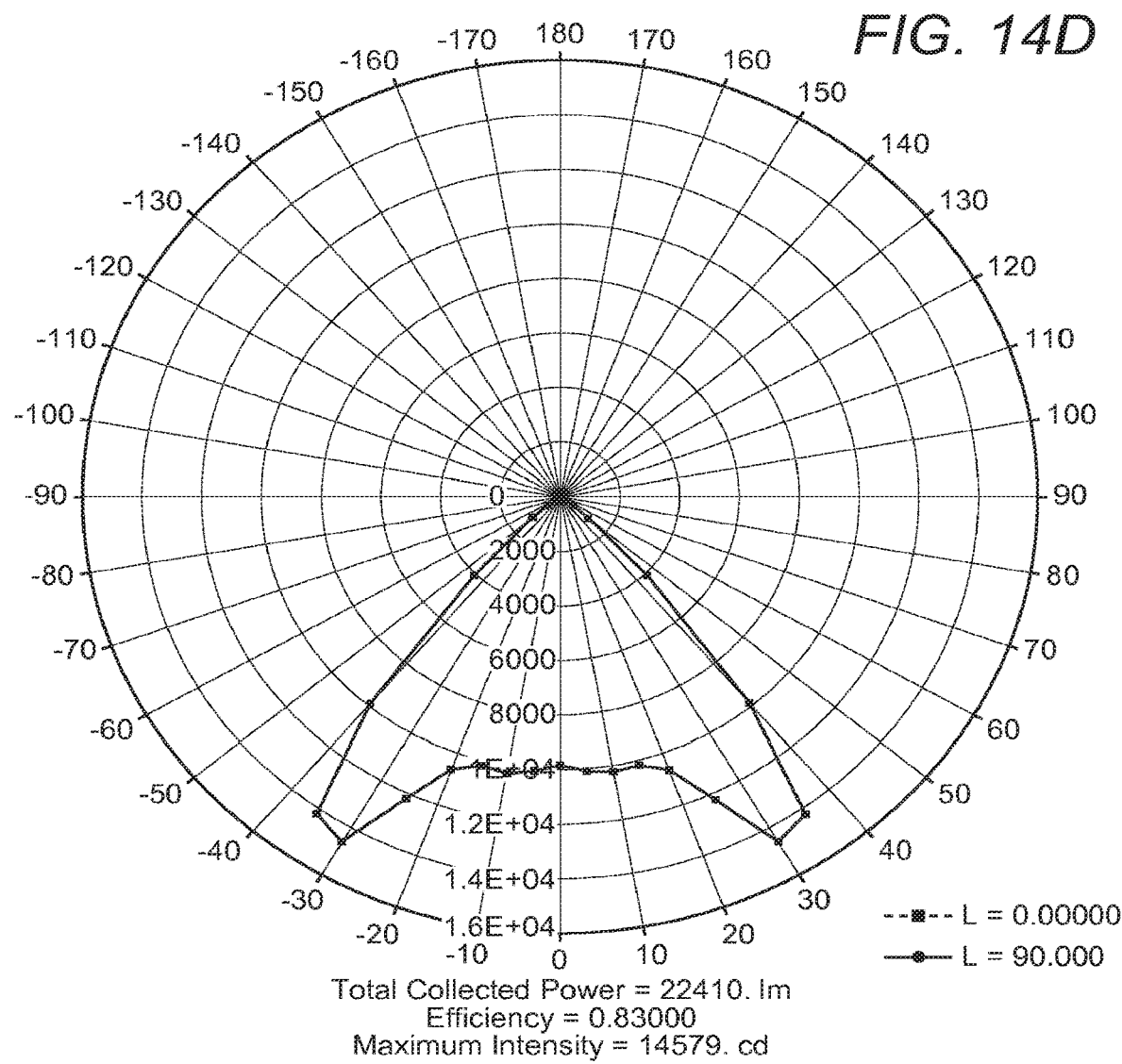

The reflector 222 can be used to raise SC over a fixture utilizing the reflector 220. Some factors that may singly or in combination contribute to this rise in SC include, but are not limited to: decreasing the upper arc radius; raising the transition point between the arcs; and/or increasing or slightly increasing the top width. One design factor in particular which can effect SC and other attributes is the location of the arc transition point. The intensity distribution of a fixture 200, but with the reflector 222 swapped for the reflector 220, is shown in FIG. 14D. In this particular embodiment of the fixture with the reflector 222 can have a maximum emission at approximately 30.degree., and/or can have a nadir emission of about 70% of maximum, and/or can have 50% of maximum intensity at approximately 40.degree., and/or can have zero or almost zero light emitted at angles over about 50.degree.. Other output attributes are clear to one of skill in the art from FIG. 14D.

Figure 14E:
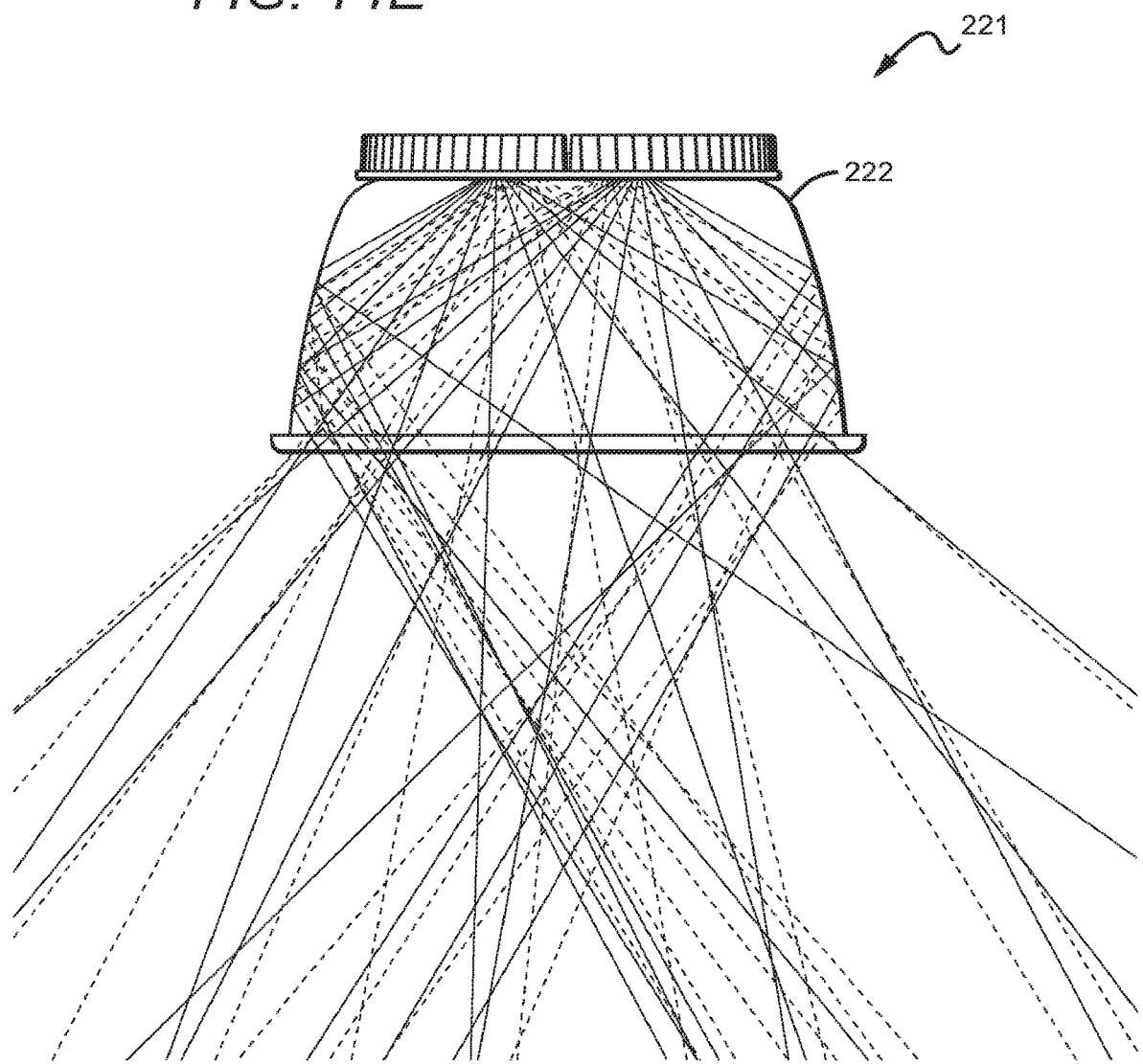

A ray trace of the fixture 221 is shown in FIG. 14E with dashed lines showing light rays produced by the inner emitters and solid lines showing light rays produced by the outer emitters. As can be seen, the percentage of light emitted at high angles can be approximately equal for both the inner and outer emitters, or the inner emitters can emit slightly more high angle light. In other embodiments, the inner emitters can emit more high angle light. In still other embodiments, the outer emitters can emit more high angle light. In this embodiment, more light is directed at approximately 30.degree. than in the FIGS. 13A-13G embodiment, while less light is directed at the nadir than in the FIGS. 13A-13G embodiment, although other embodiments are possible.

As described above, fixtures with a high SC can be used for open-space lighting, such as in large warehouses. Prior art SSL fixtures, and particularly high bay SSL fixtures, have difficulty achieving an SC sufficient for such purposes, such as an SC of about 1.6 or more. The SC of the fixture described above can be approximately 1.6 or greater, or about 1.6 to about 1.7, or about 1.64. The rise in SC over a fixture with the reflector 220 can be due to, in addition the above mentioned physical attribute differences, the lowered nadir intensity to max intensity ratio produced by the reflector 222 compared to the reflector 220 (about 70% vs. about 85%).

Figure 15A:
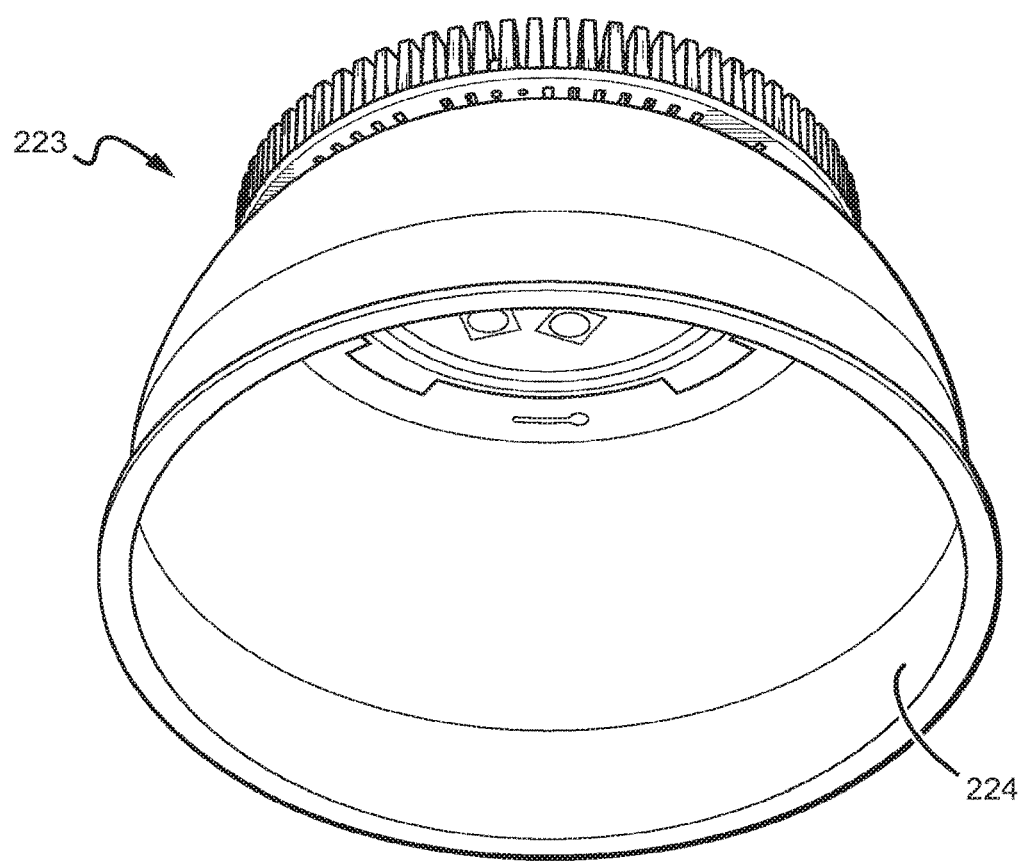
Figure 15B:
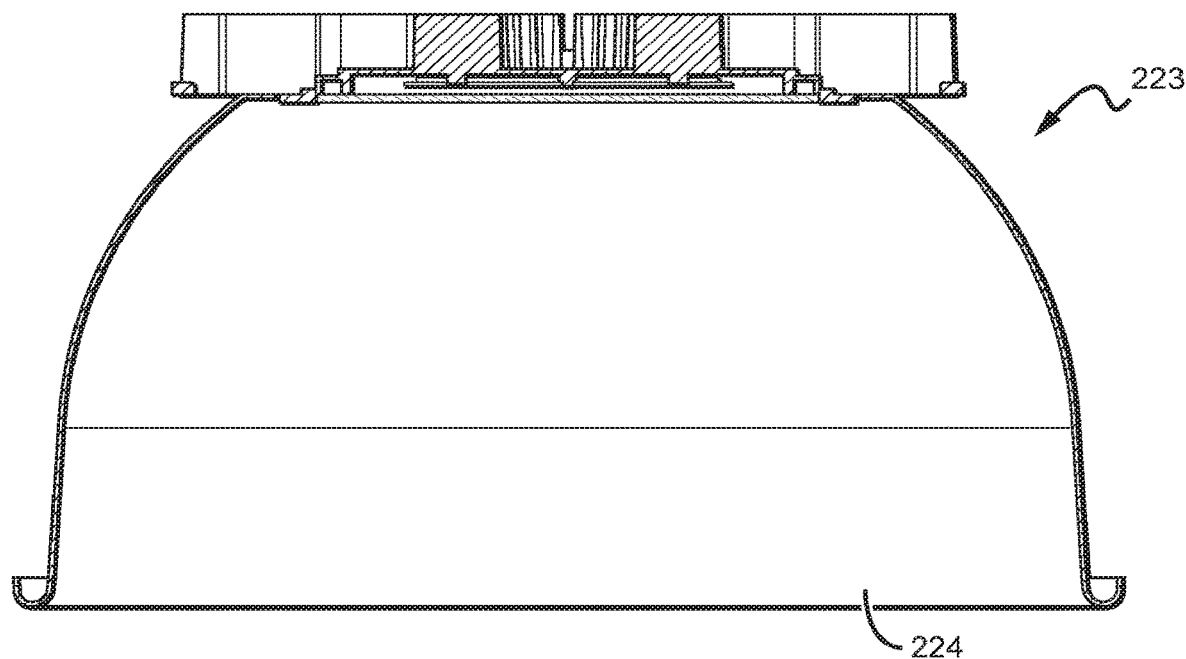

FIGS. 15A-15C show a bottom perspective, side, and dimensioned side view, respectively, of a high bay fixture 223 with a reflector 224. The reflector 224 has dimensions different than that of the reflector 220 and different than that of the reflector 222. The reflector 224 can have a profile defined by one or more arcs. As best shown in FIG. 15C, in this specific embodiment the reflector can have a profile defined by two arcs. In this specific embodiment the reflector can have a profile defined by two arcs, such as a high radius lower arc and a low radius upper arc. In this case, the radius of the lower arc can be approximately 18 times the radius of the upper arc, although smaller and larger ratios are possible. The transition between the arcs can be approximately ⅓ or less up the height of the reflector, though this transition point can be higher or lower. In the specific embodiment shown, the transition point can be about 35% up the height of the reflector. The top width of the reflector 224 can be approximately 60% of the bottom width, although other embodiments are possible. When used in combination with the specific light engine layout shown in FIG. 7B, the ratio of the top diameter of the reflector 224 to the width of the array of emitters 108 can be approximately 5:2, although higher and lower ratios are possible. Similarly, the ratio of the bottom diameter of the reflector 224 to the width of the array of emitters 108 can be approximately 4:1, and/or the ratio of the height of the reflector 220 to the width of the array of emitters 108 can be approximately 2:1, although higher and lower ratios are possible in both of these cases.

The reflector 224 can be used to lower SC over a fixture utilizing the reflector 220. Some factors that may singly or in combination contribute to this lowering of SC include, but are not limited to increasing the upper arc radius and/or lowering the transition point between the arcs. Further, the radii of both the upper and lower arcs of the reflector 224 are significantly greater than those of the reflector 222 from FIGS. 14A-14E. The intensity distribution of the fixture 223 with the reflector 224 is shown in FIG. 15D. In this particular embodiment of the fixture with the fixture 223 can have a maximum emission at approximately 5.degree., and/or can have a nadir emission of about 95%-100% of maximum, and/or can have 50% of maximum intensity at approximately 40.degree., and/or can have zero or almost zero light emitted at angles over about 50.degree.. Other output attributes are clear to one of skill in the art from FIG. 15D.

Figure 15E:
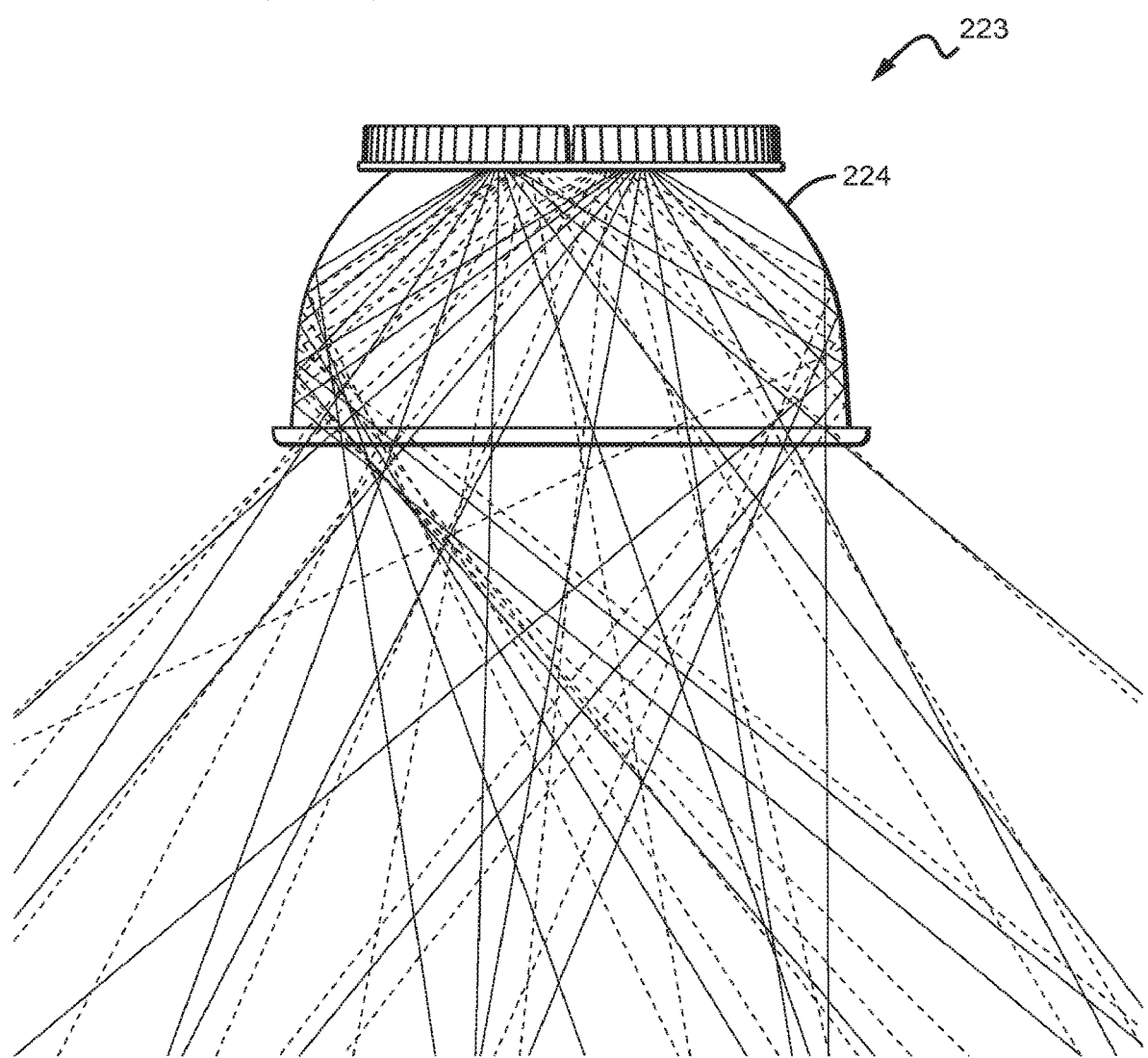

A ray trace of the fixture 223 is shown in FIG. 15E, with dashed lines showing light rays produced by the inner emitters and solid lines showing light rays produced by the outer emitters. As can be seen, the percentage of light emitted at high angles can be approximately equal for both the inner and outer emitters, or the inner emitters can emit slightly more high angle light. In other embodiments, the inner emitters can emit more high angle light. In still other embodiments, the outer emitters can emit more high angle light. In the embodiment shown, the fixture can be arranged such that light beams are not significantly directed in any particular direction, although other embodiments are possible.

As described above, fixtures with a relatively lower SC are particularly applicable to aisle lighting. The SC of the fixture described above can be approximately 1.3-1.4, or approximately 1.34. The lower SC over a fixture with the reflector 220 can be due to, in addition the above mentioned physical attribute differences, the raised nadir intensity to max intensity ratio produced by the reflector 222 compared to the reflector 220 (95%-100% vs. about 85%).

Because prior art non-SSL fixtures can utilize reflectors, embodiments of the present invention can be used to retrofit these fixtures. For example, the light engine of a prior art fixture could be replaced with the light engine 100 or a similar SSL-based light engine. The above disclosure describes manners of achieving a desirable emission profile from such a fixture, while the disclosure of application U.S. patent application Ser. No. 14/145,559 to Lui et al. and entitled "Lighting Fixture with Branching Heat Sink and Thermal Path Separation", describes some manners of addressing other issues prevalent in SSL lighting, such as heat dissipation issues not addressed herein.

It is understood that embodiments presented herein are meant to be exemplary. Embodiments of the present invention can comprise any combination of compatible features shown in the various figures, and these embodiments should not be limited to those expressly illustrated and discussed.

Although the present invention has been described in detail with reference to certain configurations thereof, other versions are possible. Therefore, the spirit and scope of the invention should not be limited to the versions described above.

The foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

What is claimed:

1. A lighting fixture, comprising:
    a heat sink comprising a mount area and heat-dissipating fins extending radially from the mount area to an outer portion of the heat sink, wherein apertures for passage of air through the heat sink are disposed between the fins;
    a plurality of LED light emitters mounted directly on the mount area; and
    a driver box radially offset from the outer portion of the heat sink for housing drive electronics to drive the plurality of LED light emitters;
    a reflector mounted below the heat sink for receiving light from the plurality of LED light emitters, the reflector comprises a curved reflective surface extending downward from the heat sink, the curved reflective surface directs the passage of air through the apertures, and the mount area or lens covering the mount area completely fills a central aperture of the heat sink.

2. The lighting fixture of claim 1 wherein the driver box is mounted to the heat sink.

3. The lighting fixture of claim 1 wherein the curved reflective surface is textured.

4. The lighting fixture of claim 1 further comprising a planar lens covering the plurality of LED light emitters and mounted inside of the reflector.

5. The lighting fixture of claim 1 wherein the reflector is partially reflective.

6. A lighting fixture, comprising:
    a heat sink comprising a mount area and a plurality of fins extending from the mount area to an outer portion of the heat sink, wherein apertures for passage of air through the heat sink are disposed between the fins;
    at least one LED light emitter coupled directly to a mount pad on the mount area of the heat sink;
    a driver box for housing drive electronics to drive the at least one LED light emitter; and
    a reflector mounted below the heat sink for receiving light from the at least one LED light emitter the reflector comprises a curved reflective surface extending downward from the heat sink, the curved reflective surface directs the passage of air through the apertures, and the mount area or lens covering the mount area completely fills a central aperture of the heat sink;
    wherein the heat sink and the reflector are disposed along a vertical axis and the plurality of fins extend in a horizontal plane.

7. The lighting fixture of claim 6 further comprising a junction box mounted over the heat sink and positioned off center from the heat sink.

8. The lighting fixture of claim 6 wherein the reflector and heat sink are configured such that the air flows outside the reflector and through the apertures between the plurality of fins, and the mount area or lens covering the mount area completely fills a central aperture of the heat sink.

9. The lighting fixture of claim 8 wherein the reflector comprises an at least partially reflective surface, wherein the at least partially reflective surface extends downward from the heat sink.

10. The lighting fixture of claim 6 wherein the reflector comprises a first end adjacent the heat sink and a second open end, the heat sink extending laterally beyond the first end.

11. A lighting fixture, comprising:
    a heat sink comprising a plurality of fins arranged in a circle, each fin comprising an inner level spoke branching into a plurality of intermediate level spokes, wherein each of the plurality of intermediate level spokes branches into a plurality of outer level spokes and the plurality of outer level spokes define channels having bottom openings and top openings;
    at least one LED light emitter thermally coupled to the heat sink; and
    an optical element configured to receive light from the at least one LED light emitter, wherein the optical element extends in a vertical dimension beyond the heat sink such that air flows outside of the optical element into the bottom openings, through the channels and out the top openings.

12. The lighting fixture of claim 11 wherein the heat sink further comprises side openings, wherein a portion of said heat sink separates the side openings and the bottom openings such that the side openings are distinct from the bottom openings.

13. The lighting fixture of claim 11 wherein the optical element comprises an at least partially reflective curved surface, wherein the at least partially reflective curved surface comprises two or more differing radii of curvature.

14. The lighting fixture of claim 11 wherein the optical element comprises a first end adjacent the heat sink and a second open end, the heat sink extending laterally beyond the first end.

15. The lighting fixture of claim 11 wherein the heat sink and the optical element are disposed along an axis and the plurality of fins extend in a plane perpendicular to the axis.

16. The lighting fixture of claim 11 wherein the heat sink is in contact with the optical element.

\* \* \* \* \*